US009385651B2

United States Patent
Zong et al.

(10) Patent No.: US 9,385,651 B2
(45) Date of Patent: Jul. 5, 2016

(54) 60 GHZ FREQUENCY GENERATOR INCORPORATING THIRD HARMONIC BOOST AND EXTRACTION

(71) Applicants: Zhirui Zong, Delft (NL); Masoud Babaie, Pijnacker (NL); Robert Bogdan Staszewski, Dublin (IE)

(72) Inventors: Zhirui Zong, Delft (NL); Masoud Babaie, Pijnacker (NL); Robert Bogdan Staszewski, Dublin (IE)

(73) Assignee: Short Circuit Technologies LLC, Rochester, NY (US)

( * ) Notice: Subject to any disclaimer, the term of this patent is extended or adjusted under 35 U.S.C. 154(b) by 0 days.

(21) Appl. No.: 14/874,416

(22) Filed: Oct. 3, 2015

(65) Prior Publication Data

US 2016/0099681 A1    Apr. 7, 2016

Related U.S. Application Data

(60) Provisional application No. 62/059,415, filed on Oct. 3, 2014.

(51) Int. Cl.
*H03B 5/12* (2006.01)
*H03L 7/081* (2006.01)
*H03L 7/099* (2006.01)

(52) U.S. Cl.
CPC .............. *H03B 5/1212* (2013.01); *H03B 5/124* (2013.01); *H03B 5/1228* (2013.01); *H03B 5/1265* (2013.01); *H03B 5/1281* (2013.01); *H03B 5/1293* (2013.01); *H03L 7/081* (2013.01); *H03L 7/0991* (2013.01)

(58) Field of Classification Search
CPC ...... H03B 5/08; H03B 5/1228; H03B 5/1265; H03B 5/1293; H03D 3/24; H03D 3/241

USPC .................................. 331/117 R, 117 FE, 167
See application file for complete search history.

(56) References Cited

U.S. PATENT DOCUMENTS

| 4,614,917 | A | 9/1986 | Zelitzki et al. |
| 6,111,678 | A | 8/2000 | Mathoorasing et al. |
| 6,463,112 | B1 * | 10/2002 | Hafez ................... H03L 7/185 327/157 |
| 8,456,246 | B2 * | 6/2013 | Lee ..................... H03B 5/1228 331/117 FE |

(Continued)

OTHER PUBLICATIONS

Okada, K. et al., "A 60-GHz 16QAM/8PSK/QPSK/BPSK Direct-Conversion Transceiver for IEEE802.15.3c", IEEE JSSC, vol. 46, No. 12, pp. 2988-3004, Dec. 2011.

(Continued)

*Primary Examiner* — Jeffrey Shin
(74) *Attorney, Agent, or Firm* — Zaretsky Patent Group PC; Howard Zaretsky

(57) ABSTRACT

A novel and useful 60 GHz frequency generator based on a third harmonic extraction technique which improves system level efficiency and performance. The frequency generator employs a third harmonic boosting technique to increase the third harmonic at the output of the oscillator. The oscillator generates both ~20 GHz fundamental and a significant amount of the third harmonic at ~60 GHz and avoids the need for a frequency divider operating at 60 GHz. The undesired fundamental harmonic at ~20 GHz is rejected by the good fundamental harmonic rejection ratio (HRR) inherent in the oscillator buffer stage while the ~60 GHz component is amplified to the output. The fundamental harmonic is further suppressed by active cancellation by properly combining the two outputs. The oscillator fabricated in 40 nm CMOS exhibits a phase noise of −100 dBc/Hz at 1 MHz offset from a 60 GHz carrier and have a tuning range of 25%.

20 Claims, 14 Drawing Sheets

(56) References Cited

U.S. PATENT DOCUMENTS

| | | | |
|---|---|---|---|
| 2004/0178857 A1* | 9/2004 | Jacobsson | H03B 5/1231 331/117 R |
| 2010/0248647 A1* | 9/2010 | Wachi | H03L 7/099 455/73 |
| 2011/0156829 A1* | 6/2011 | Wang | H03L 7/0802 331/117 FE |
| 2013/0214870 A1* | 8/2013 | Mangraviti | H03L 7/24 331/117 R |
| 2014/0077890 A1 | 3/2014 | Babaie et al. | |

OTHER PUBLICATIONS

Marcu, C. et al., "A 90 nm CMOS Low-Power 60 GHz Transceiver With Integrated Baseband Circuitry", IEEE JSSC, vol. 44, No. 12, pp. 3434-3447, Dec. 2009.

Tabesh, M. et al., "A 65 nm CMOS 4-Element Sub-34 mW/Element 60 GHz Phased-Array Transceiver", IEEE JSSC, vol. 46, No. 12, pp. 3018-3032, Dec. 2011.

Saito,N. et al.,"A Fully Integ. 60-GHz CMOS Transc Chipset Based on WiGig/IEEE 802.11ad With Built-In Self Calib for Mobile Usage",IEEE JSSC,vol. 48,No. 12,pp. 3146-3159,Dec. 2013.

Okada, K. et al., "Full Four-Channel 6.3-Gb/s 60-GHz CMOS Transceiver With Low-Power Analog and Digital Baseband Circuitry", IEEE JSSC, vol. 48, No. 1, pp. 46-65, Jan. 2013.

Vidojkovic, V. et al., "A Low-Power Radio Chipset in 40nm LP CMOS with Beamforming for 60GHz High-Data-Rate Wireless Communication", IEEE ISSCC 2013, pp. 236-237, 2013.

Razavi, B. et al., "A Low-Power 60-GHz CMOS Transceiver for WiGig Applications", Symp on VLSI Circ 2013, pp. C300-C301, 2013.

Wu, W. et al., "A 56.4-to-63.4 GHz Multi-Rate All-Digital Fractional-N PLL for FMCW Radar Applications in 65 nm CMOS", IEEE JSSC, vol. 49, No. 5, pp. 1081-1096, May 2014.

Szortyka, V. et al., "A 42mW 230fs-Jitter Sub-sampling 60GHz PLL in 40nm CMOS", ISSCC 2014, pp. 366-367, 2014.

Long, J.R. et al., "Passive Circuit Technologies for mm-Wave Wireless Systems on Silicon", IEEE Trans Circ. and Syst., vol. 59, No. 8, pp. 1680-1693, Aug. 2012.

Tiebout, M., "A CMOS Direct Injection-Locked Oscillator Topology as High-Frequency Low-Power Frequency Divider", IEEE JSSCC, vol. 39, No. 7, pp. 1172-1174, Jul. 2004.

Gu, Q. et al., "A Low Power V-Band CMOS Frequency Divider With Wide Locking Range and Accurate Quadrature Output Phases", IEEE JSSC, vol. 43, No. 4, pp. 991-998, Apr. 2008.

Chao, Y. et al., "Analysis and Design of a 2.9-mW 53.4-79.4-GHz Freq-Tracking Inj-Locked Frequency Divider in 65-nm CMOS", IEEE JSSC, vol. 48. No. 10, pp. 2403-2418, Oct. 2013.

Siriburanon, T. et al., "A 60-GHz Sub-Sampling Frequency Synthesizer Using Sub-Harmonic Injection-Locked Quadrature Oscillators", IEEE RFIC 2014, pp. 105-108, 2014.

Chan, W.L. et al., "A 56-65 GHz Injection-Locked Frequency Tripler With Quadrature Outputs in 90-nm CMOS", IEEE JSSC, vol. 43, No. 12, pp. 2739-2746, Dec. 2008.

Sadhu, B. et al., "A 46.4-58.1 GHz Frequency Synthesizer Featuring a 2nd Harmonic Extraction Technique that Preserves VCO Performance", IEEE RFIC 2014, pp. 173-176, 2014.

Chao,Y. et al., Anal and Design of a 14.1-mW 50/100-GHz Transf-Based PLL With Emb Phase Shifter in 65-nm CMOS,IEEE Trans Micro Theory & Tech, vol. 63,No. 4,pp. 1194-1201,Apr. 2015.

Kim, H. et al., "A Low Phase-Noise CMOS VCO With Harmonic Tuned LC Tank", IEEE Trans Microwave Theory & Techniques, vol. 54, No. 7, pp. 2917-2924, Jul. 2006.

Babaie, M. et al., "A Class-F CMOS Oscillator", IEEE JSSC, vol. 48, No. 12, pp. 3120-3133, Dec. 2013.

Razavi, B., "A Study of Phase Noise in CMOS Oscillators", IEEE JSSC, vol. 31, No. 3, pp. 331-343, Mar. 1996.

Yeh, Y.L. et al.,"A W-Band Wide Locking Range and Low DC Power Inj-Locked Freq Tripler Using Transf Coupled Tech",IEEE Trans Micro Thry & Tech,vol. 61,No. 2,pp. 860-870,Feb. 2013.

Chan, W.L. et al., "A 58-65 GHz Neutralized CMOS Power Amplifier With PAE Above 10% at 1-V Supply", IEEE JSSC, vol. 45, No. 3, pp. 554-564, Mar. 2010.

Hajimiri, A. et al., "A General Theory of Phase Noise in Electrical Oscillators", IEEE JSSC, vol. 33, No. 2, pp. 179-194, Feb. 1998.

Murphy, D. et al., "Phase Noise in LC Oscillators: A Phasor-Based Analysis of a General Result and of Loaded Q", IEEE Trans. Circ. & Syst.,vol. 57,No. 6, pp. 1187-1203, Jun. 2010.

Groszkowski, J., "The Interdependence of Frequency Variation and Harmonic Content, and the Problem of Constant-Frequency Oscillators", Proc IRE, vol. 21, No. 7, pp. 958-981,1933.

Rael, J.J. et al., "Physical Processes of Phase Noise Differential LC Oscillators", Proc IEEE CICC 2000, pp. 569-572, 2000.

Fanori, L. et al., "Class-D CMOS Oscillators", IEEE JSSC, vol. 48, No. 12, pp. 3105-3119, Dec. 2013.

Wu, W. et al., "High-Resolution Millimeter-Wave Digitally Controlled Oscillators With Reconfigurable Passive Resonators",IEEE JSSC, vol. 48, No. 11, pp. 2758-2794, Nov. 2013.

Borremans, J. et al., "VCO design for 60 GHz applications using differential shielded inductors in 0.13 μm CMOS", IEEE RFIC 2008, pp. 135-138, 2008.

Li, L. et al., "Design and Analysis of a 90 nm mm-Wave Oscillator Using Inductive-Division LC Tank", IEEE JSSC, vol. 44, No. 7, pp. 1950-1958, Jul. 2009.

PCT/US2015/053895, Written Opinion, Feb, 1, 2016.

\* cited by examiner

60 GHZ FREQUENCY GENERATOR INCORPORATING THIRD HARMONIC BOOST AND EXTRACTION

REFERENCE TO PRIORITY APPLICATION

This application claims priority to U.S. Provisional Application Ser. No. 62/059,415, filed Oct. 3, 2014, entitled "Oscillators," incorporated herein by reference in its entirety.

FIELD OF THE INVENTION

The present invention relates generally to oscillator circuits and in particular to a 60 GHz frequency generator with implicit divider based on third harmonic extraction.

BACKGROUND OF THE INVENTION

High data-rate wireless communications at 60 GHz set stringent phase noise (PN) requirements on local oscillators (LOs). Furthermore, LOs require a wide tuning range (TR) to cover the specified frequency bands (e.g., 57 to 66 GHz) with margin for process, voltage and temperature (PVT) variations. Meanwhile, long battery lifetime calls for high power efficiency thus, ultimately, high figure-of-merit (FoM). Unfortunately, CMOS implementations of such 60 GHz LOs suffer from poor PN, limited TR and high power consumption.

There is thus a need for an oscillator that is able to operate at high frequencies in the 60 GHz range that is power efficient, exhibits low phase noise and has a wide enough tuning range to meet the strict requirements of wireless standards with sufficient margin while abiding by the process technology reliability rules.

SUMMARY OF THE INVENTION

The present invention is a frequency generator incorporating an implicit divide by three divider (i.e. third harmonic extraction) suitable for use at 60 GHz providing improved system level efficiency and phase noise. The frequency generator employs a third harmonic boosting technique to increase the third harmonic at the output of the oscillator. The oscillator generates both ~20 GHz fundamental and a significant amount of the third harmonic at ~60 GHz thus avoiding the need for a frequency divider operating at 60 GHz. The undesired fundamental harmonic at ~20 GHz is rejected by the good fundamental HRR inherent in the architecture of the oscillator buffer stage while the ~60 GHz component is amplified to the output.

The oscillator fabricated in 40 nm CMOS exhibits a phase noise of −100 dBc/Hz at 1 MHz offset from a 60 GHz carrier and have a tuning range of 25%. The oscillator and/or frequency generator can be incorporated within a wide range of circuit applications, including for example a conventional phase locked loop (PLL), all-digital phase-locked loop (AD-PLL), wireline transceiver circuits and mobile devices.

Compared to prior art 60 GHz oscillators, the oscillator of the present invention provides several advantages: (1) larger inductance and capacitance of the resonant tank lowers the oscillator sensitivity to parasitics, thus resulting in wider frequency tuning range; (2) oscillation at 20 GHz provides a better Q-factor in the resonant tank and lower $1/f^3$ corner; and (3) the third harmonic injection results in a lower rms value of the impulse sensitivity function, thus further reducing the phase noise.

There is thus provided in accordance with the invention, a frequency generator circuit, comprising an oscillator, the oscillator comprising a transformer based LC tank circuit operative to generate a feedforward signal containing both a fundamental frequency component and a third harmonic component, the oscillator operative to generate a feedback signal containing substantially only the fundamental frequency component, and wherein the feedback signal is utilized for purposes of phase detection.

There is also provided in accordance with the invention, an oscillator circuit, comprising a pair of transistors for sustaining the oscillation of the oscillator circuit, the transistors each having a gate terminal and a drain terminal, a transformer comprising a primary winding and a secondary winding, the primary winding coupled to both the drain terminals of the transistors, the secondary winding coupled to both the gate terminals of the transistors, a first tunable capacitor coupled to the primary transformer winding, a second tunable capacitor coupled to the secondary transformer winding, wherein the oscillator exhibits a first input impedance magnitude peak at a fundamental frequency and a second input impedance magnitude peak at a third harmonic frequency, wherein Barkhausen criterion is satisfied at the fundamental frequency but not at the third harmonic frequency thereby the oscillator circuit has a single oscillation mode at the fundamental frequency, and wherein a gate waveform is combined with a drain waveform to perform active fundamental cancellation.

There is further provided in accordance with the invention, a millimeter wave (mm-wave) frequency generator circuit, comprising a phase/frequency detector, a low pass filter coupled to the phase/frequency detector, an oscillator incorporating a transformer based LC tank circuit and coupled to the low pass filter, the oscillator operative to generate an output signal having both fundamental and third harmonic components, boost the level of the third harmonic component, satisfy Barkhausen criterion at the fundamental frequency but not at the third harmonic frequency wherein the oscillator circuit has a single oscillation mode at the fundamental frequency, a power amplifier coupled to the output of the oscillator and adapted to receive as input the output signal from the oscillator, the power amplifier operative to substantially filter the fundamental component from the output signal while amplifying the third harmonic component thereof, and a frequency divider coupled to the oscillator and the phase/frequency detector.

There is also provided in accordance with the invention, a millimeter wave (mm-wave) frequency generator circuit, comprising a phase/frequency detector, a low pass filter coupled to the phase/frequency detector, an oscillator incorporating a transformer based LC tank circuit and coupled to the low pass filter, the oscillator comprising an active network having an input and an output, the active network operative to generate an active signal for sustaining the oscillation of the oscillator, a transformer based resonator differential tank circuit coupled to the active network and operative to generate a signal coupled to the active network input, wherein the differential tank circuit has a first impedance magnitude peak at a fundamental frequency and a second impedance magnitude peak at a third harmonic frequency, wherein the oscillator satisfies Barkhausen criterion at the fundamental frequency but not at the third harmonic frequency so that the oscillator circuit has a single oscillation mode at the fundamental frequency, a power amplifier coupled to the output of the oscillator and adapted to receive as input the output signal from the oscillator, the power amplifier operative to substantially filter the fundamental component from the output signal while amplifying the third harmonic component thereof, and a frequency divider coupled to the oscillator and the phase/frequency detector.

BRIEF DESCRIPTION OF THE DRAWINGS

The invention is herein described, by way of example only, with reference to the accompanying drawings, wherein.

DETAILED DESCRIPTION OF THE INVENTION

High Frequency Oscillator

Figure 1:
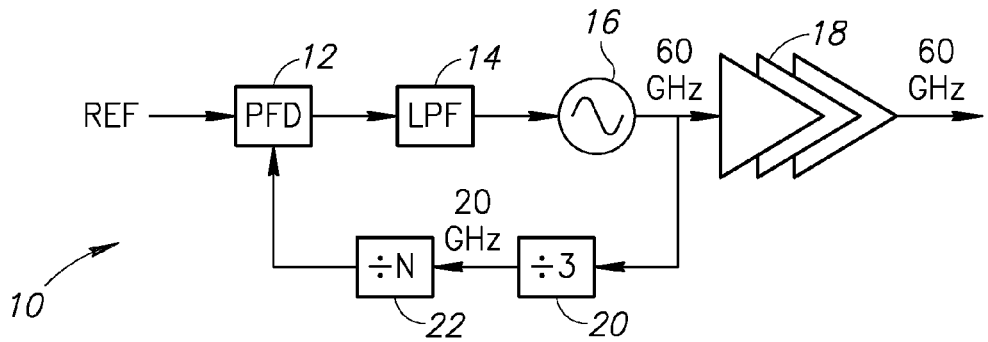
FIG. 1 is a high level block diagram illustrating a first example millimeter wave (mm-wave) phase locked loop (PLL) circuit.

A high level block diagram illustrating a first example millimeter wave (mm-wave) phase locked loop (PLL) circuit is shown in FIG. 1. The PLL, generally referenced 10, is operative to generate a 60 GHz signal. The circuit comprises a phase/frequency detector 12, low pass filter (LPF) 14, VCO or DCO 16, 60 GHz divide by three 20, divide by N 22 and a 60 GHz output power amplifier 18.

It is noted that oscillators and high frequency dividers are some of the key challenges in designing a 60 GHz PLL. The architecture of PLL 10 employs a 60 GHz oscillator 16, which feeds both a 60 GHz frequency divider 20 for phase detection with a frequency reference clock and a power amplifier (PA) 18 to drive an antenna. In this embodiment, however, the oscillator PN is severely affected by poor Q-factor of the resonant tank. The dividers 20, 22 are typically power hungry and occupy large silicon area and suffer from limited locking range.

Figure 2:
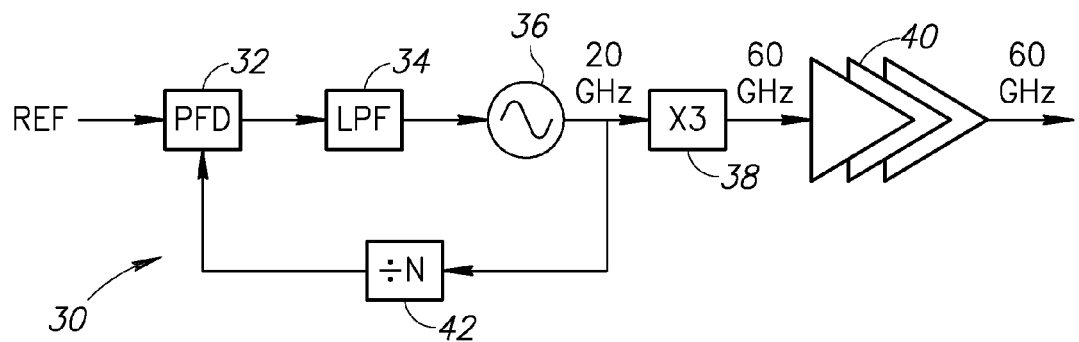
FIG. 2 is a high level block diagram illustrating a second example mm-wave PLL circuit.

A high level block diagram illustrating a second example millimeter wave (mm-wave) phase locked loop (PLL) circuit is shown in FIG. 2. The PLL, generally referenced 30, is operative to generate a 60 GHz signal. The circuit comprises a phase/frequency detector 32, low pass filter (LPF) 34, VCO or DCO 36, 20 GHz divide by N 42, frequency trippler 38 and a 60 GHz output power amplifier 40.

In this embodiment, the frequency tripling PLL 38 relieves the design challenges described supra but shifts them to the injection locked frequency trippler (ILFT). Thus, the system level issues remain.

Figure 3:
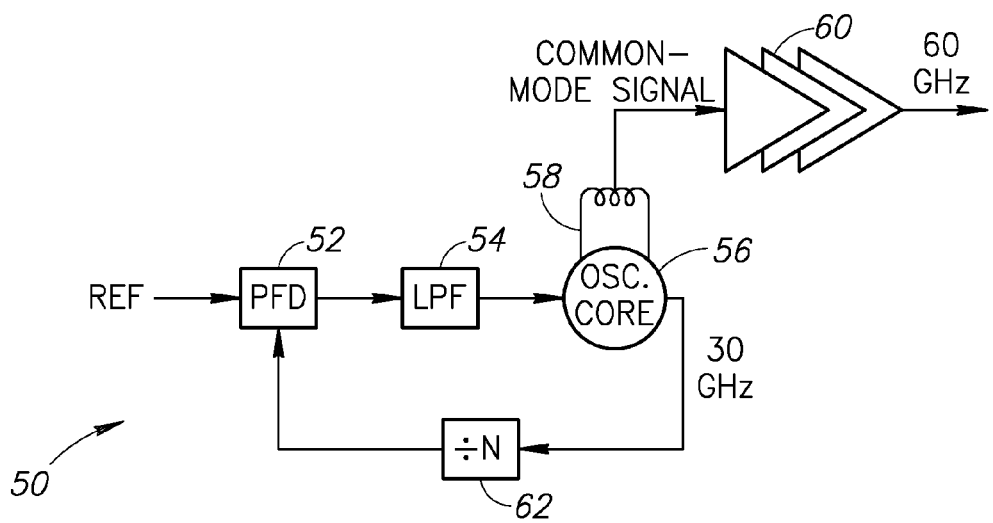
FIG. 3 is a high level block diagram illustrating a third example mm-wave PLL circuit.

A high level block diagram illustrating a third example millimeter wave (mm-wave) phase locked loop (PLL) circuit is shown in FIG. 3. The PLL, generally referenced 50, is operative to generate a 60 GHz signal. The circuit comprises a phase/frequency detector 52, low pass filter (LPF) 54, VCO or DCO 56, divide by N 62 and a 60 GHz output power amplifier 60.

This embodiment provides a common mode (CM) extraction PLL that is operative to trap the existing second harmonic at the common mode node 58 of the 30 GHz differential oscillator. Thus, this design eliminates the problematic frequency multipliers of the PLL designs discussed supra. Nevertheless, the large common mode swing dramatically increases the 1/f noise upconversion. Also the conversion of a single ended common mode signal to a differential output may introduce large phase error.

Figure 4:
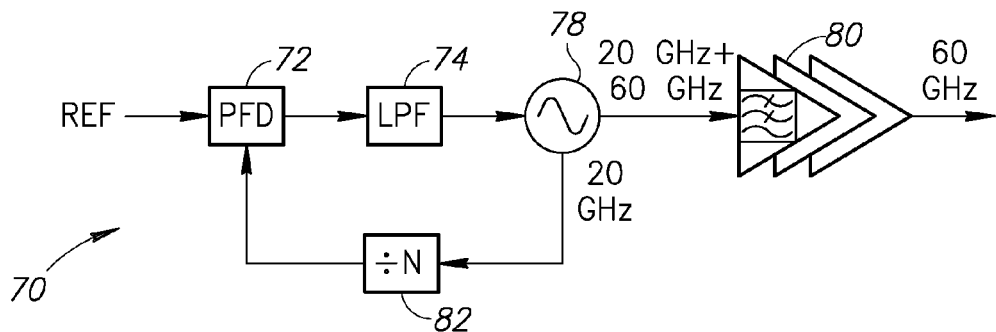
FIG. 4 is a high level block diagram illustrating a fourth example mm-wave PLL circuit.

To alleviate the above design challenges of mm-wave oscillators and dividers with minimum impact on other circuitry, the present invention provides a 60 GHz local oscillator (LO) with an implicit divide by three divider. A high level block diagram illustrating a fourth example millimeter wave (mm-wave) phase locked loop (PLL) architecture is shown in FIG. 4. The PLL, generally referenced 70, is operative to generate a 60 GHz signal. The circuit comprises a phase/frequency detector 72, low pass filter (LPF) 74, VCO or DCO 78, divide by N 82 and output power amplifier 80.

The basic concept of the frequency generator of the present invention is that the oscillator simultaneously generates the fundamental at 20 GHz and its third harmonic at 60 GHz. The 60 GHz signal is fed forward to the buffer/PA while the 20 GHz signal is fed back to the phase detector after further frequency division, as shown in FIG. 4. Consequently, the divide by three functionality is inherent with the 60 GHz oscillator thus avoiding any physical divider operating at the 60 GHz carrier. This leads to a dramatic increase in the system level efficiency.

The ~20 GHz fundamental harmonic, however, must be suppressed at the output of the power amplifier. Thus, a filtering function is needed in the feed forward path. Fortunately, mm-wave buffers and PAs are typically loaded by LC tanks, which function as natural band pass filters (BPF). Therefore, their natural BPF filtering is exploited here to reject the ~20 GHz fundamental frequency component.

Third Harmonic Boosting Techniques

In one embodiment, a third-harmonic technique is exploited to lower the phase sensitivity to circuit noise in a class-F oscillator. The third harmonic of the generated voltage, however, is relatively weak (e.g., ~15%). In addition, if thick oxide devices are used due to reliability concerns, they will limit the frequency tuning range and thus are preferably avoided. In order to reduce the required gain of the following buffer, a much stronger third harmonic is desired. The frequency generator of the present invention includes a harmonic boosting technique for a transformer based dual-tank oscillator that significantly increases the voltage level of the third harmonic.

Figure 5:
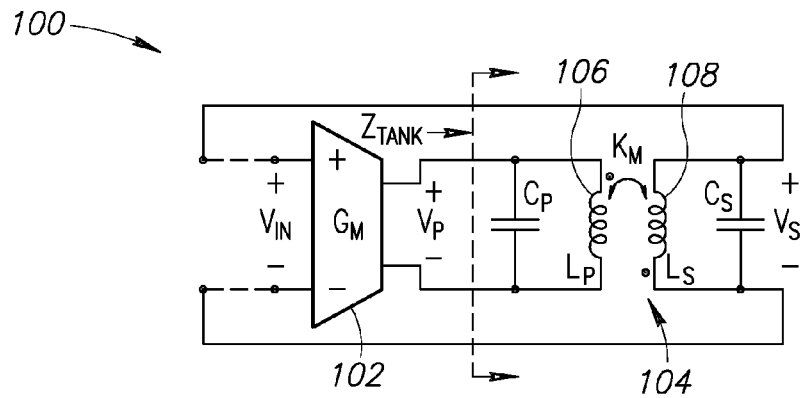
FIG. 5 is a high level schematic diagram of an example of the third harmonic tuned oscillator of the present invention.
Figure 6:
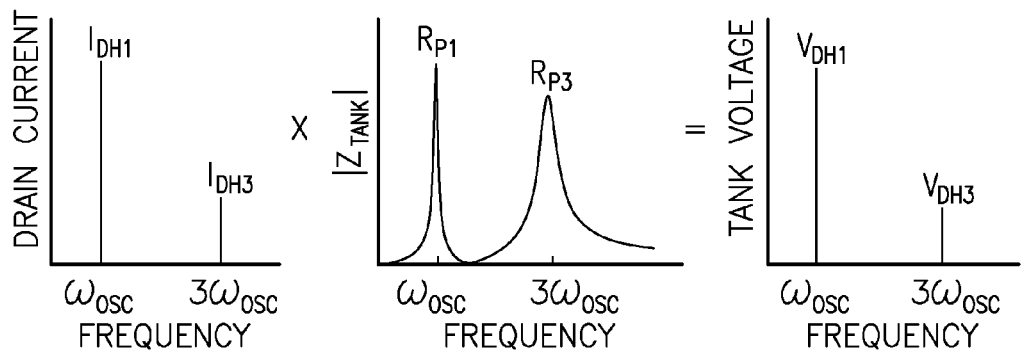
FIG. 6 is a diagram illustrating the operational principle of the oscillator in the frequency domain.

An example method of and related trade-off in increasing the third harmonic will now be described. A high level schematic diagram of an example of the third harmonic tuned oscillator of the present invention is shown in FIG. 5. A diagram illustrating the operational principle of the oscillator in the frequency domain is shown in FIG. 6. The oscillator, generally referenced 100, comprises $g_m$ block 102 coupled to a first LC tank consisting of capacitor $C_P$ and primary winding 106 of transformer 104 and to a second LC tank consisting of capacitor $C_S$ and secondary winding 108 of transformer 104.

To generate a stronger third harmonic voltage, there are two possible options: (1) increasing the ratio of the drain current at the first and third harmonic ($I_{DH3}/I_{DH1}$); or (2) increasing the ratio of the tank impedance at the first and third harmonic ($R_{p3}/R_{p1}$). The $I_{DH3}/I_{DH1}$ ratio, however, is typically fixed for a certain type of oscillator. Consequently, a larger $R_{p3}/R_{p1}$ ratio is desired. On the other hand, a high Q-factor at $\omega_{osc}$ is necessary for good phase noise performance, while low Q at $3\omega_{osc}$ is desired for tolerance to frequency misalignment between the second (~$3\omega_{osc}$) and first resonances ($\omega_{osc}$). Since the oscillator is a two-port dual-tank oscillator and the secondary winding's loading effects on the primary winding and its Q-factor are not straightforward to estimate as in traditional one-port LC resonators, the equivalent Q-factor ($Q_{eq}$) is derived from the phase response of the open-loop transfer function $V_s/V_{in}$ and can be expressed in the following equations:

$$H_{ol}(s) = \frac{v_s(s)}{v_{in}(s)} = -G_{in} \cdot Z_{trans}(s) \quad (1)$$

$$Q_{eq} = \frac{\omega}{2} \cdot \left| \frac{d[\angle H_{ol}(j\omega)]}{d\omega} \right| \quad (2)$$

Figure 7:
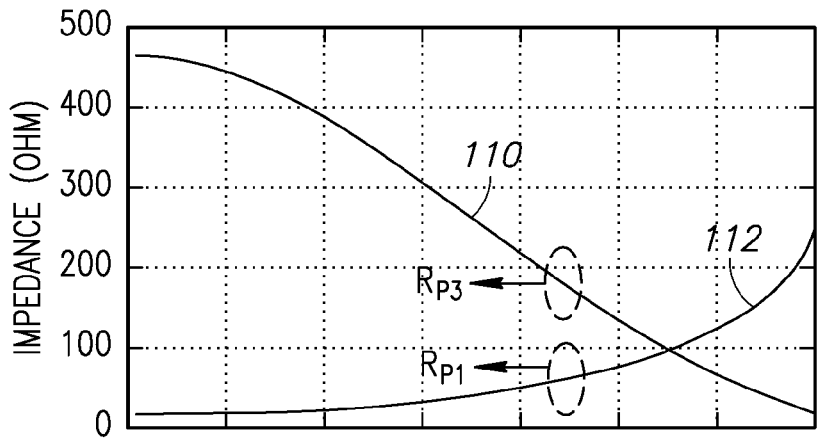
FIG. 7 is a graph illustrating the relationship of the tank impedance versus $k_m$.
Figure 8:
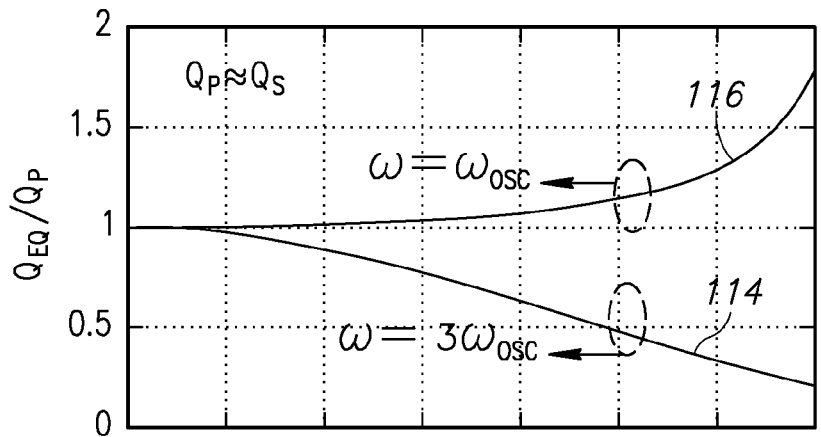
FIG. 8 is a graph illustrating the relationship of the equivalent Q-factor ($Q_{eq}$) versus $k_m$.
Figure 9:
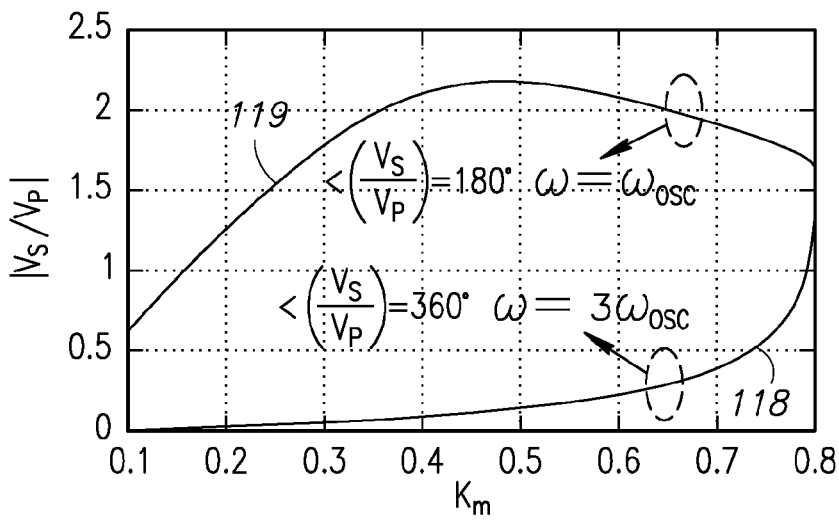
FIG. 9 is a graph illustrating the relationship of the transfer gain $V_S/V_P$ versus $k_m$.

Note that $Q_{eq}$ is higher than the Q-factor of the individual transformer winding at $\omega_{osc}$, while it is lower than the individual winding's Q at $3\omega_{osc}$. The magnetic coupling coefficient $k_m$ affects the tank impedance $Z_{tank}$ and $Q_{eq}$. A graph illustrating the relationship of the tank impedance versus $k_m$ is shown in FIG. 7. A graph illustrating the relationship of the equivalent Q-factor ($Q_{eq}$) versus $k_m$ is shown in FIG. 8. A graph illustrating the relationship of the transfer function gain $V_S/V_P$ versus $k_m$ is shown in FIG. 9. As indicated in the graph $R_{p1}$ (trace 112) decreases with smaller $k_m$, while $R_{p3}$ (trace 110) behaves oppositely. Therefore, a smaller $k_m$ is desired for larger a $R_{p3}/R_{p1}$ ratio. The $Q_{eq}/Q_p$ ratio drops at the third harmonic for larger values of $k_m$ while the $Q_{eq}/Q_p$ ratio increases at the fundamental for larger $k_m$ values. A larger $k_m$, however, is required for the optimal $Q_{eq}$ at $\omega_{osc}$ and $3\omega_{osc}$. As a tradeoff, $k_m$ is advantageously set to 0.61 in the example embodiment described herein for $R_{p3}/R_{p1}>1$ with a correspondingly sufficient Q-factor.

Considering oscillation mode stability, the associated start-up conditions are examined to ensure that the oscillation can only happen at ~20 GHz, even if $R_{p3}>R_{p1}$. As is well-known, Barkhausen's phase and gain criteria must be satisfied for stable oscillation. The resonator introduces 180° and 360° phase shifts at $\omega_{osc}$ and $3\omega_{osc}$, respectively. Together with the 180° phase shift from the $G_m$ stage, it forces positive loop feedback at 20 GHz but negative feedback at 60 GHz. Therefore, the Barkhausen criterion is not satisfied at $3\omega_{osc}$ and there is only one oscillation mode at ~20 GHz. Analysis and simulations conducted by the inventors reveal that the open loop phase response $\angle V_s/V_{in}=0°$ at $\omega=\omega_{osc}$, while $\angle V_s/V_{in}=-180°$ at $\omega=3\omega_{osc}$. Thus, the phase criterion can be satisfied only at the first resonant frequency (~20 GHz).

Moreover, the open loop magnitude response of $V_s/V_p$ is investigated. At ~20 GHz, the transformer tank exhibits a transfer gain of 2.2 (6.85 dB) from primary to secondary, while at ~60 GHz, it has a transfer attenuation of 0.24 (−12.40 dB). This property effectively cleans up the third harmonic component in the secondary winding of the transformer.

Third Harmonic Boosting Oscillator

Figure 10A:
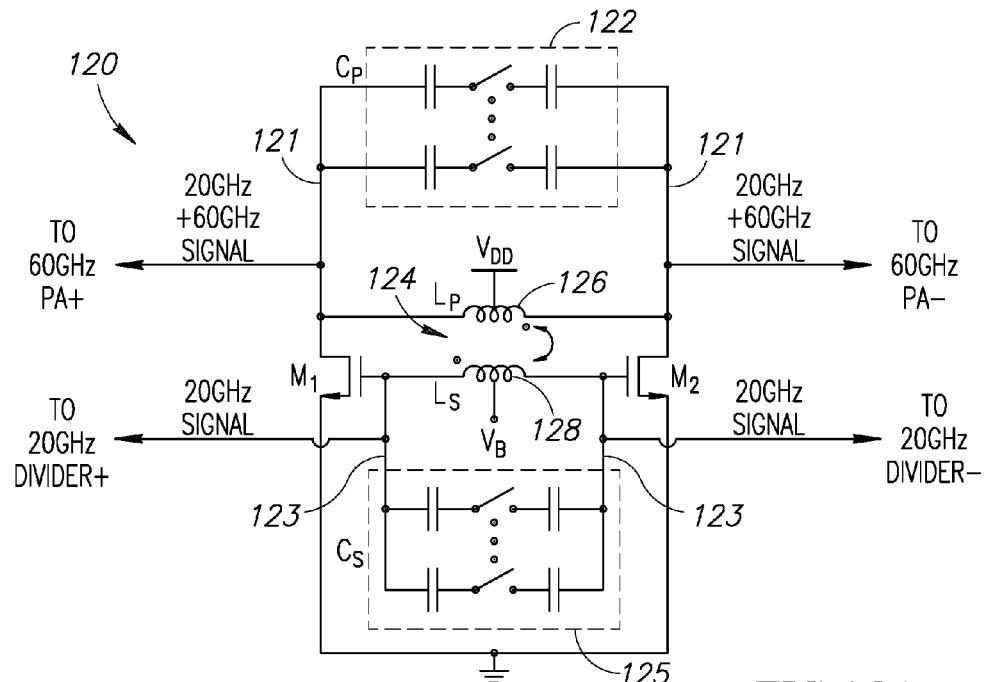
FIG. 10A is a schematic diagram of a first example third harmonic boosting oscillator of the present invention.

A high level schematic diagram of a first example third harmonic boosting oscillator of the present invention is shown in FIG. 10A. The oscillator, generally referenced 120, comprises a pair of transistors $M_1$, $M_2$ whose drain terminals 121 are coupled to an LC tank consisting of primary winding 126 of transformer 124 and tunable switched capacitor bank $C_P$ 122, and whose gate terminals 123 are coupled to an LC tank consisting of secondary winding 128 of transformer 124 and tunable switched capacitor bank $C_S$ 125. Gate terminals 123 are coupled to a 20 GHz divider while drain terminals 121 are coupled to a 60 GHz power amplifier.

In one example embodiment, to mitigate the breakdown stress on the core transistors and avoid thick oxide devices, a lower supply voltage ($V_{DD}=0.7V$) is used. A 1:2 transformer of $k_m=0.61$ together with switched metal oxide metal (MOM) capacitor banks in the primary and secondary windings comprise the resonant tank. The $C_S$ capacitor bank provides coarse tuning, while the $C_p$ capacitor bank adjusts the second resonance close to $3\omega_{osc}$. The PA is driven by the drain nodes of $M_{1,2}$ to deliver sufficient power at 60 GHz. The gate nodes provide the clean 20 GHz signal with a large swing for phase detection feedback.

Figure 10B:
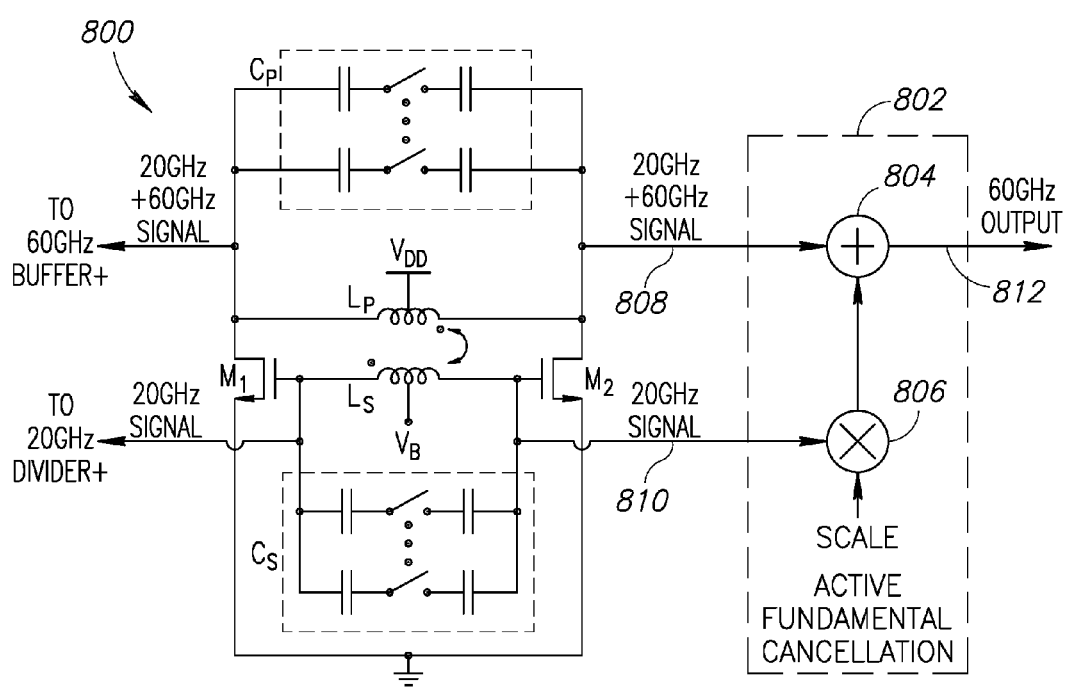
FIG. 10B is a schematic diagram of a second example third harmonic boosting oscillator of the present invention with active fundamental cancellation.

A high level schematic diagram of a second example third harmonic boosting oscillator of the present invention is shown in FIG. 10B. The oscillator, generally referenced 800, is constructed similarly to that of FIG. 10A with the addition of an active fundamental cancellation circuit 802. The circuit 802 circuit comprises a multiplier 806 for scaling the 20 GHz output signal 810. The scaled signal is then input to adder 804 which combines it with the 60 GHz signal 808 to generate a 60 GHz output signal 812 thereby cancelling the 20 GHz component.

Figure 10C:
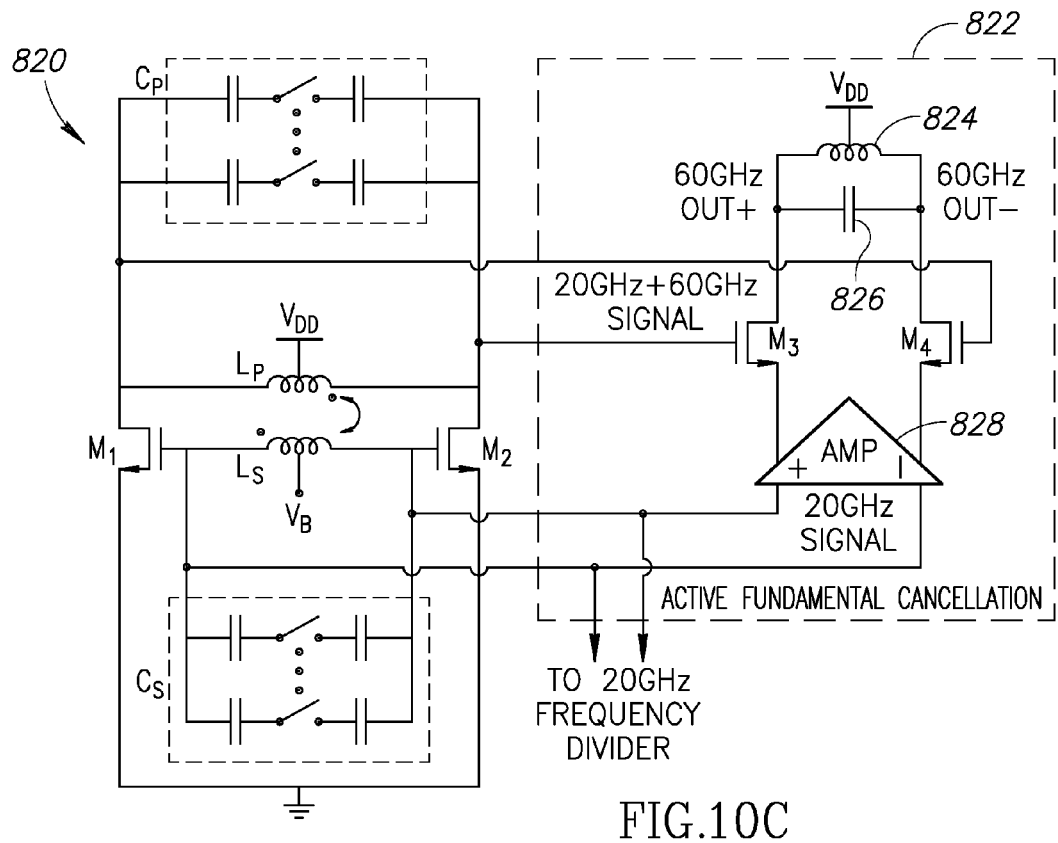
FIG. 10C is a schematic diagram of a third example third harmonic boosting oscillator of the present invention with active fundamental cancellation.

A high level schematic diagram of a third example third harmonic boosting oscillator of the present invention is shown in FIG. 10C. The oscillator, generally referenced 820, is constructed similarly to that of FIG. 10A with the addition of an active fundamental cancellation circuit 822. The circuit 822 circuit comprises amplifier 828, transistors $M_3$ and $M_4$, inductor 824 and capacitor 826.

The oscillator provides two different outputs. The output at the gate nodes of $M_1$ and $M_2$ is a pure sinusoidal signal at the fundamental frequency (e.g., ~20 GHz). The output at the drain nodes of $M_1$ and $M_2$ contains the fundamental frequency (e.g., ~20 GHz) and its strong third harmonic component (e.g., ~60 GHz). In order to obtain a clean spectrum at 60 GHz and remove the undesired 20 GHz fundamental component, an active cancellation technique is provided. In operation, the 20 GHz output at the oscillator gate nodes of $M_1$ and $M_2$ is delivered through a buffer/transconductance amplifier 828 to the source nodes of an NMOS differential pair (i.e. $M_3$ and $M_4$), while the 20 GHz and 60 GHz signal from the drain nodes of $M_1$ and $M_2$ is input to the gates of $M_3$ and $M_4$. By scaling the signal level of the 20 GHz input from the gates of $M_1$ and $M_2$, the 20 GHz component at the gates of $M_3$ and $M_4$ can be made equal to the 20 GHz component at the drains of $M_3$ and $M_4$. Therefore, $V_{gs}$ (i.e. the voltage difference between gate and drain of $M_3$ or $M_4$) is at 60 GHz. The drain current of transistors $M_3$ and $M_4$ thus contains only the 60 GHz frequency component, thereby effectively cancelling the fundamental frequency component. A clean sinusoidal signal at 60 GHz (e.g., differential 60 GHz signal) can therefore be generated at the output.

Figure 11:
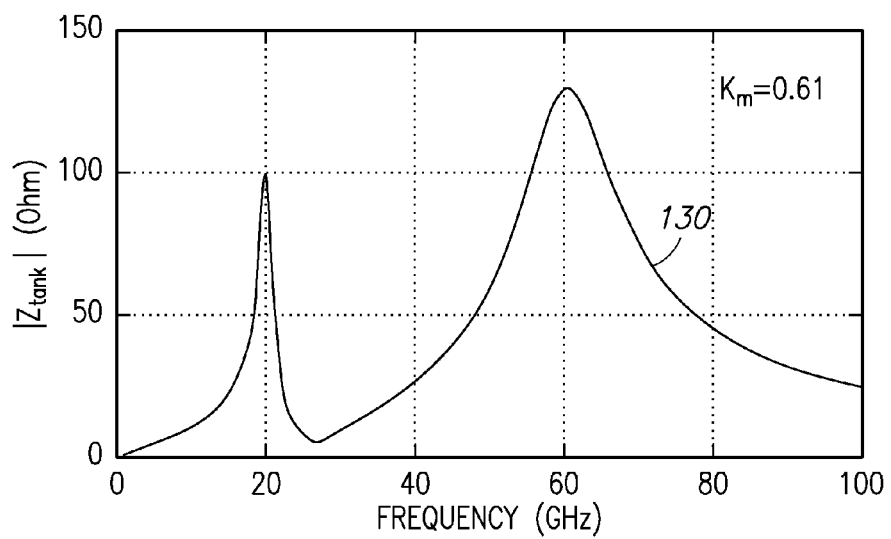
FIG. 11 is a graph illustrating the input impedance of the transformer based resonator tank.
Figure 12:
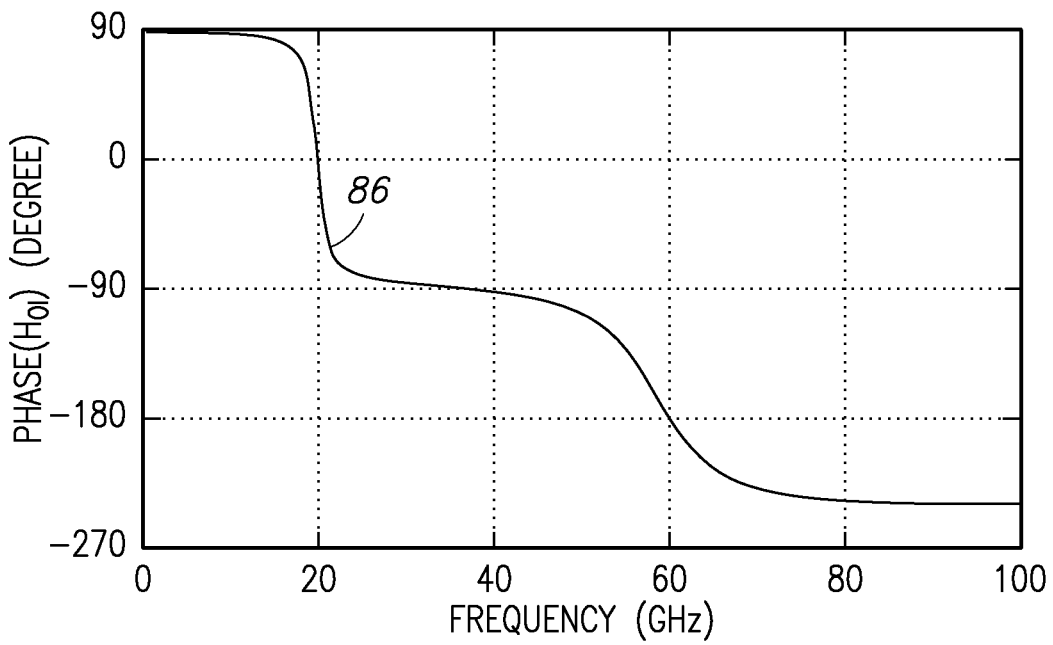
FIG. 12 is a graph illustrating the phase versus frequency.

A graph illustrating the input impedance of the transformer based resonator tank is shown in FIG. 11. Trace 130 shows an impedance peak at the fundamental frequency 20 GHz and a larger peak at 60 GHz. A graph illustrating the phase versus frequency is shown in FIG. 12. Trace 86 shows a phase of approximately 0 degrees at 20 GHz and −180 degrees at 60 GHz.

Figure 13:
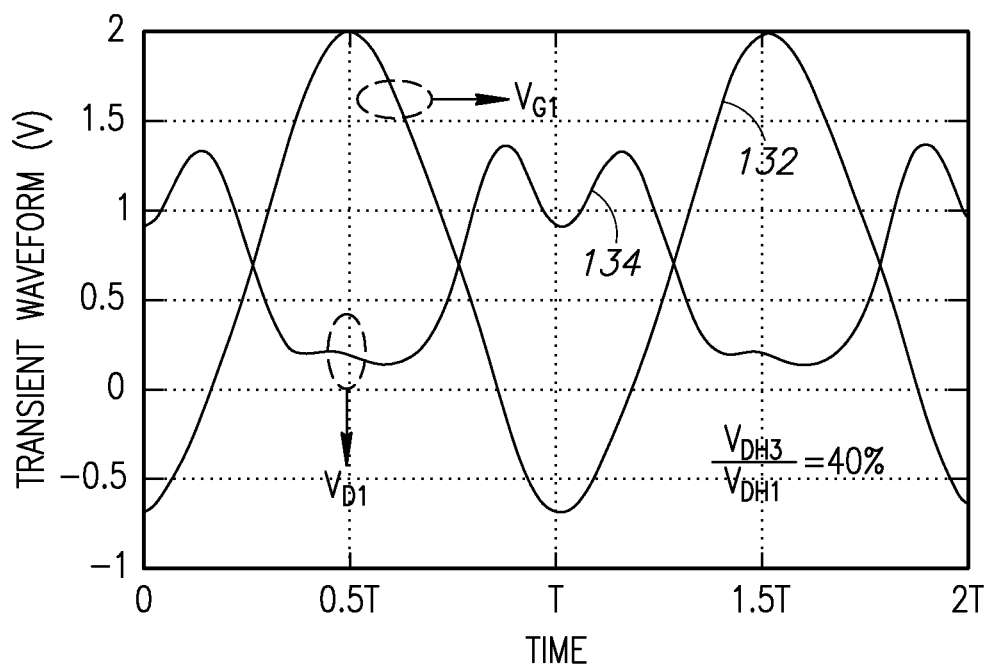
FIG. 13 is a graph illustrating simulated waveforms of the oscillator of FIG. 10.

A graph illustrating simulated waveforms of the oscillator of FIG. 10A is shown in FIG. 13. Trace 132 represents $M_1$ gate voltage while trace 134 represents $M_1$ drain voltage. The simulated waveforms reveal that the voltage ratio of the third harmonic $V_{DH3}$ to the fundamental $V_{DH1}$ is ~40% at the drain nodes 121, while a clean waveform at fundamental frequency is restored at the gate nodes 123. Regarding phase noise, the phase noise difference between 20 GHz and 60 GHz is very close to a theoretical value of $20 \cdot \log_{10} 3$ dB or about 9.5 dB.

Figure 14:
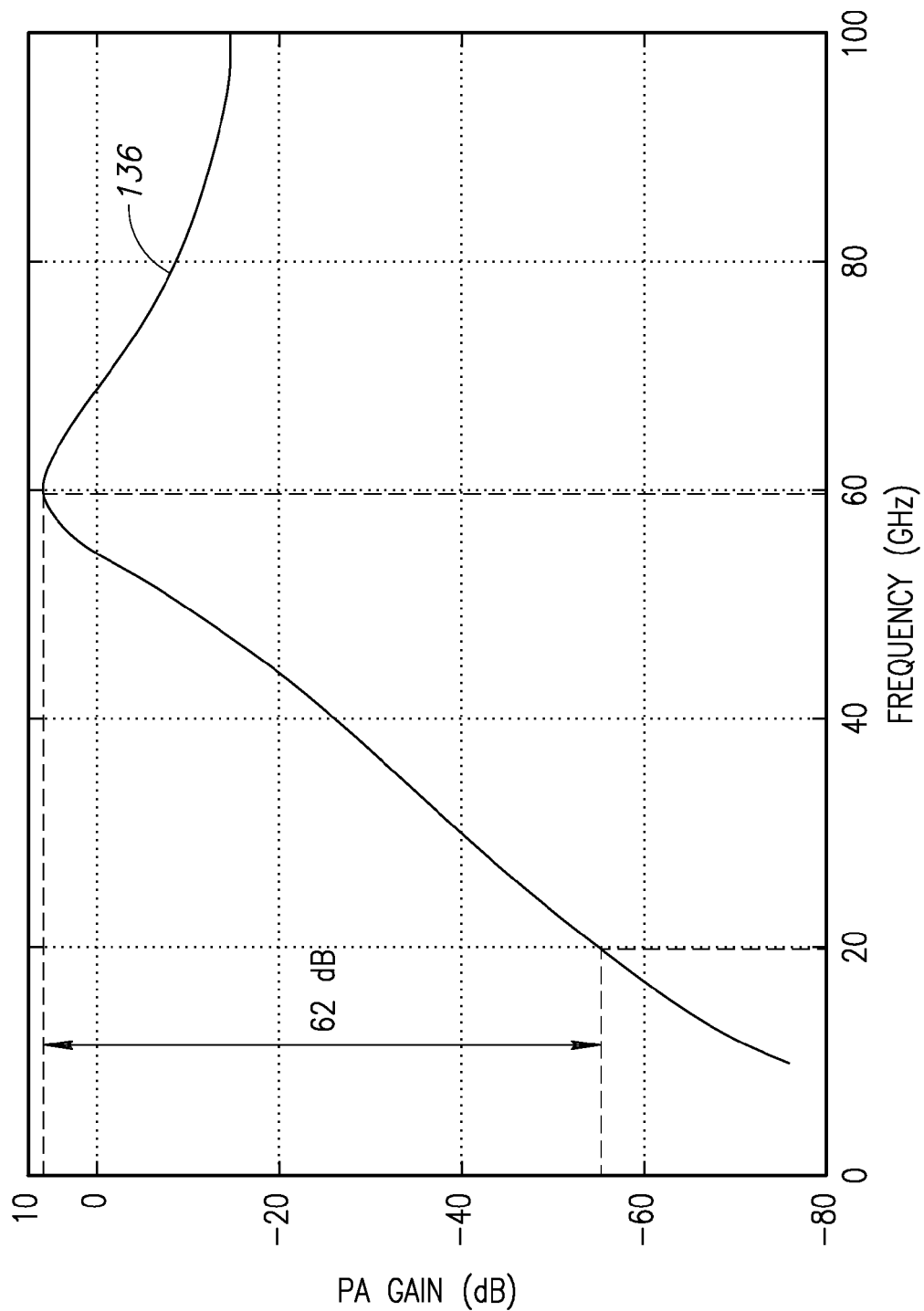
FIG. 14 is a graph illustrating the simulated PA transfer function.

In one embodiment, the 60 GHz signal is delivered to an external 50 ohm load through a 3-stage neutralized PA. Due to the natural band pass filtering capability associated with the 60 GHz PA, 62 dB suppression of the 20 GHz signal is obtained in simulations, as shown in FIG. 14. It is noted that this is achieved at no extra cost and is inherent in the structure of the PA.

Figure 15:
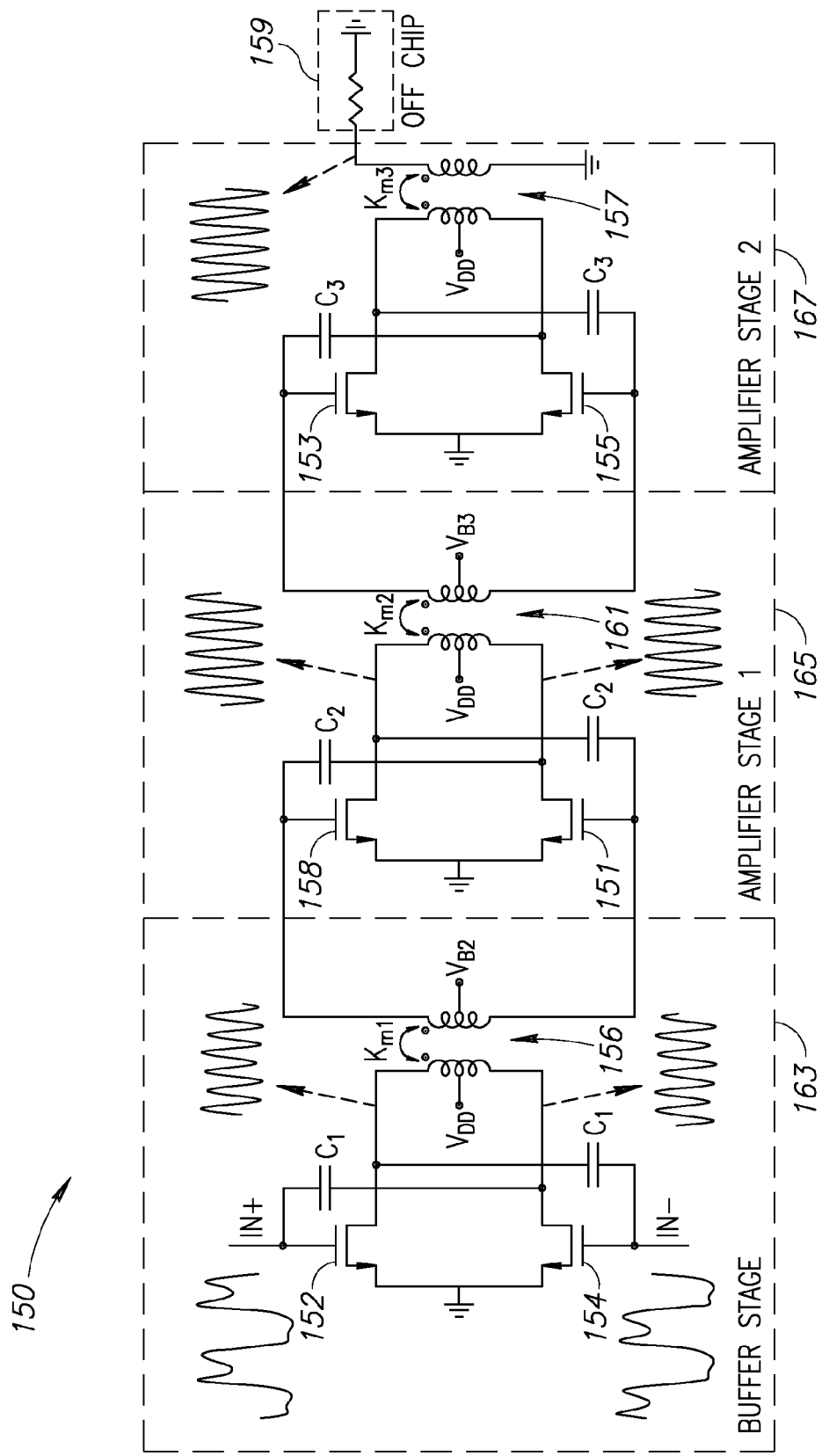
FIG. 15 is a high level schematic diagram illustrating an example 60 GHz power amplifier as well as voltage waveforms at each of the nodes.
Figure 16:
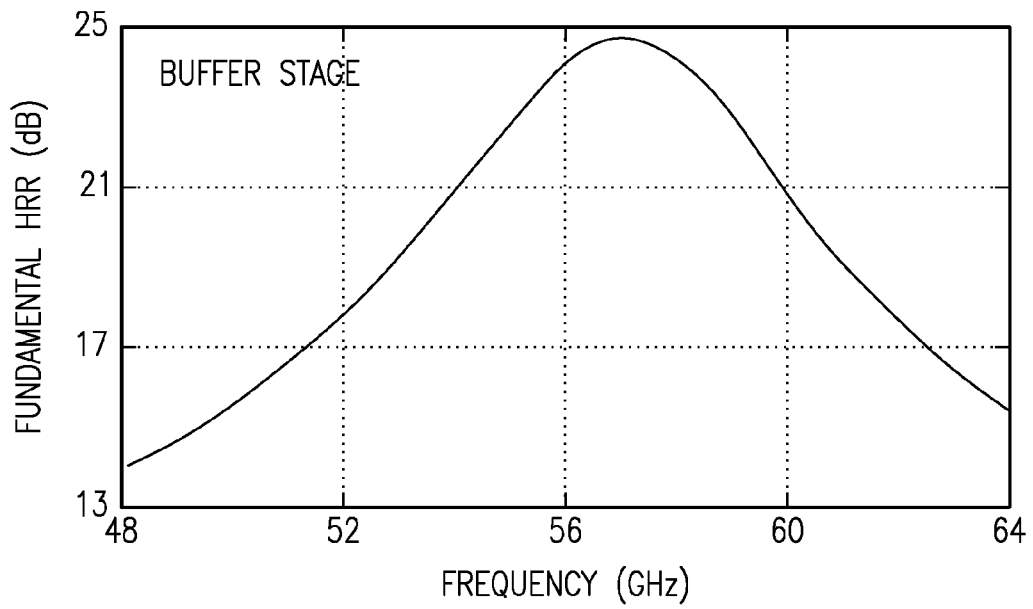
FIG. 16 is a graph illustrating the harmonic rejection ratio (HRR) versus frequency.

The output buffer/fundamental harmonic rejection stage of the frequency generator will now be described in more detail. A common-source amplifier (transistors 152, 154) with transformer loading 156 is designed as the oscillator buffer stage (buffer stage #1 (163)), as shown in FIG. 15. Simulations performed by the inventors show that the buffer stage 163 provides a fundamental harmonic rejection ratio (HRR) of 14 to 25 dB across the frequency range of 50 to 66 GHz, while consuming 10.5 mA from a 1 V supply. As shown in FIG. 16, over the 55 to 63 GHz range, the fundamental HRR is greater than 19 dB, which is better than that of many prior art injection locked frequency tipplers (ILFTs).

It is noted that the good fundamental HRR is a byproduct of the buffer stage used in the frequency generator architecture. No extra 'cost' (e.g., power amplifier gain) is required to obtain such an HRR.

In one embodiment, two additional amplifier stages (amplifier stage 1 (165) and amplifier stage 2 (167)) are added after buffer stage 163 to form a PA. Note that in this embodiment, the PA is used for measurement purposes (i.e. to overcome the large loss in 60 GHz cables and probes as well as conversion loss in the external test mixers). Neutralization capacitors ($C_1$, $C_2$ and $C_3$) are added to improve the differential mode stability factor. Similar to the buffer stage, each of the amplifier stages provides good HRR to further suppress the undesired fundamental tone at ~20 GHz at no extra cost.

The undesired fundamental tone at ~20 GHz can be further suppressed in an active manner (i.e., active fundamental tone cancellation) by properly combining the drain and gate signals. As shown in FIG. 13, the drain voltage contains a fair amount of the fundamental frequency component whose ratio to the fundamental component at the gate node is fixed. By properly scaling down the $V_{G1}$ waveform and adding it to $V_{D1}$, fundamental cancellation on $V_{D1}$ can be achieved. Advantageously, the operation is differential, meaning $V_{G1}$-$V_{G2}$ is scaled and subtracted from $V_{D1}$-$V_{D2}$.

Compared to prior art 60 GHz oscillators, the oscillator of the present invention provides several advantages: (1) larger inductance and capacitance of the resonant tank lowers the oscillator sensitivity to parasitics, thus resulting in wider frequency tuning range; (2) oscillation at 20 GHz provides a better Q-factor in the resonant tank and lower $1/f^3$ corner; and (3) third harmonic injection results in a lower rms value of the impulse sensitivity function, thus further reducing the phase noise.

Performance Results

The 60 GHz frequency generator of the present invention with the implicit divide by three frequency divider was fabricated in 40 nm CMOS. The measured phase noise at 57.8 GHz while drawing 13.5 mW from a 0.7 V supply, at an offset of 1 MHz, is −100.1 dBc/Hz.

The measured leakage of the ~20 GHz fundamental (marker 1) is −55 dBm or −60.3 dBc. Due to the leakage from the oscillator and the nonlinearity of the power amplifier, the second harmonic at ~40 GHz (marker 2) is visible at −47 dBm or −52.3 dBc.

The tuning range of the frequency generator is about 25% and extends from 48.4 to 62.5 GHz. Note that the power consumption of the buffer stage (10.5 mW) is included in the FoM and FoM$_T$ calculations. The phase noise varies between −98.8 and −100.1 dBc/Hz. The FoM has the worst value of 179 dBc/Hz at the lowest frequencies and the best value of 181.9 dBc/Hz at the highest frequencies. Since the switched capacitors have lower Q-factor in the on-state, the FoM at lower frequencies decreases.

In one embodiment, the 60 GHz power amplifier 80 (FIG. 4) delivers a maximum of +6 dBm power (after de-embedding the losses) to an external 50 Ω load, while consuming 58 mA from a 1 V supply.

Alternative Oscillator Embodiment

Figure 17:
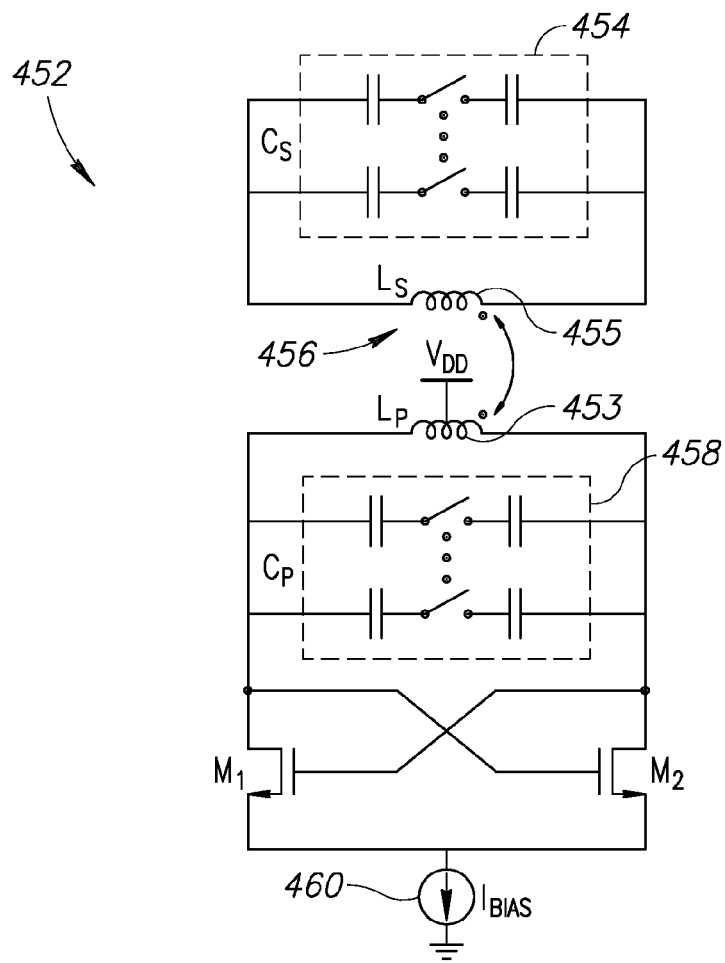
FIG. 17 is a high level schematic diagram illustrating an alternative embodiment of the oscillator of the present invention.

A high level schematic diagram illustrating an alternative embodiment of the oscillator of the present invention is shown in FIG. 17. In this alternative embodiment, generally referenced 452, the LC tank based on the secondary winding 455 of the transformer 456 is moved (compared to the oscillator of FIG. 10A) while the primary winding 453 remains connected to the drain terminals of now cross-coupled transistor pair $M_1$ and $M_2$. Current bias $I_{bias}$ 460 is connected to the source terminals of the transistor pair $M_1$ and $M_2$.

Phase Locked Loop Embodiment

Figure 18:
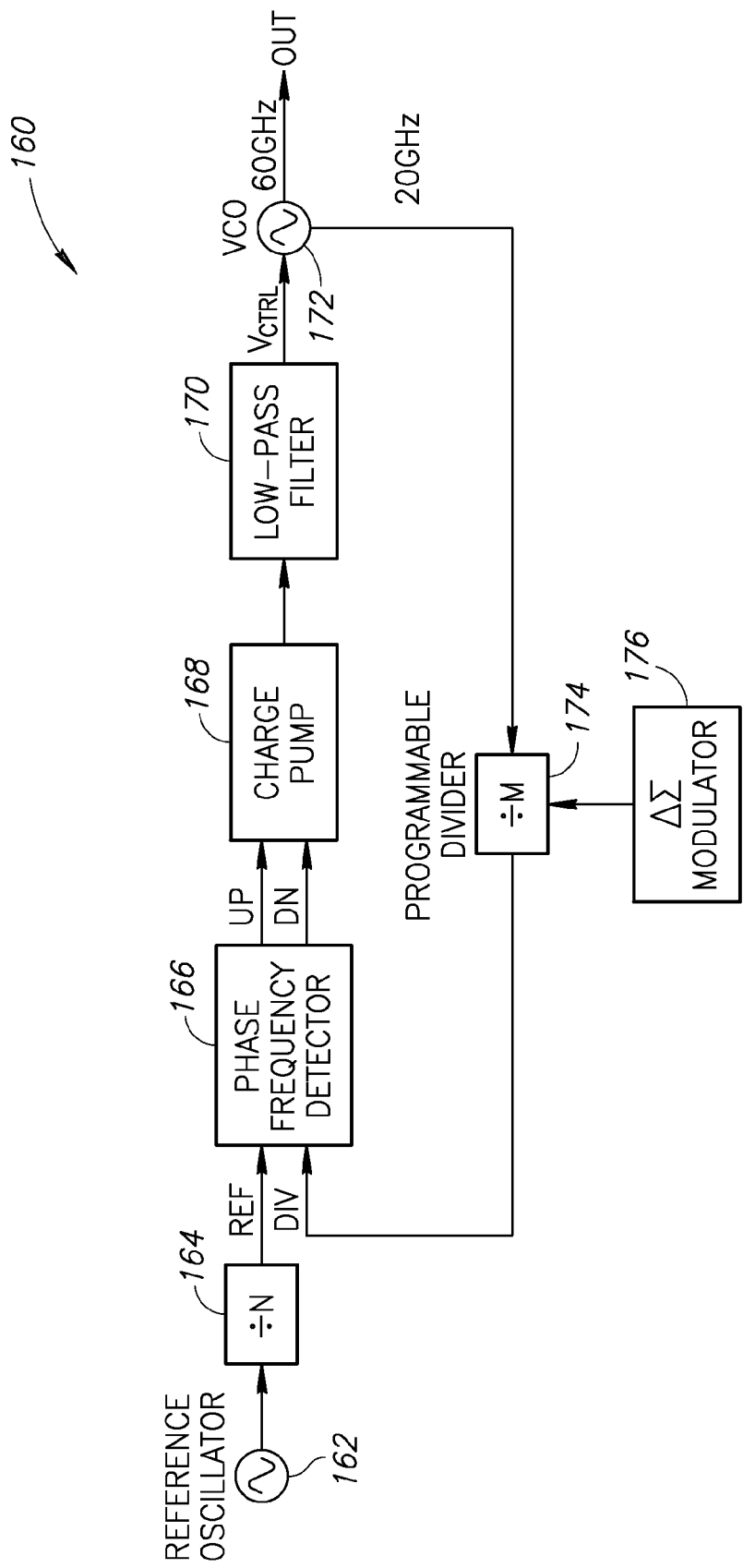
FIG. 18 is a block diagram illustrating an example phase locked loop incorporating the oscillator/frequency generator of the present invention.

A block diagram illustrating an example phase locked loop (PLL) incorporating the oscillator/frequency generator of the present invention is shown in FIG. 18. The PLL, generally referenced 160, comprises a reference oscillator 172 having two outputs: feedforward (60 GHz) and feedback (20 GHz), ÷N divider 164, phase/frequency detector 166, charge pump 168, low pass filter 170, voltage controlled oscillator (VCO) 172 incorporating the oscillator of the present invention, programmable ÷M divider 174 and ΣΔ modulator 176.

Figure 19:
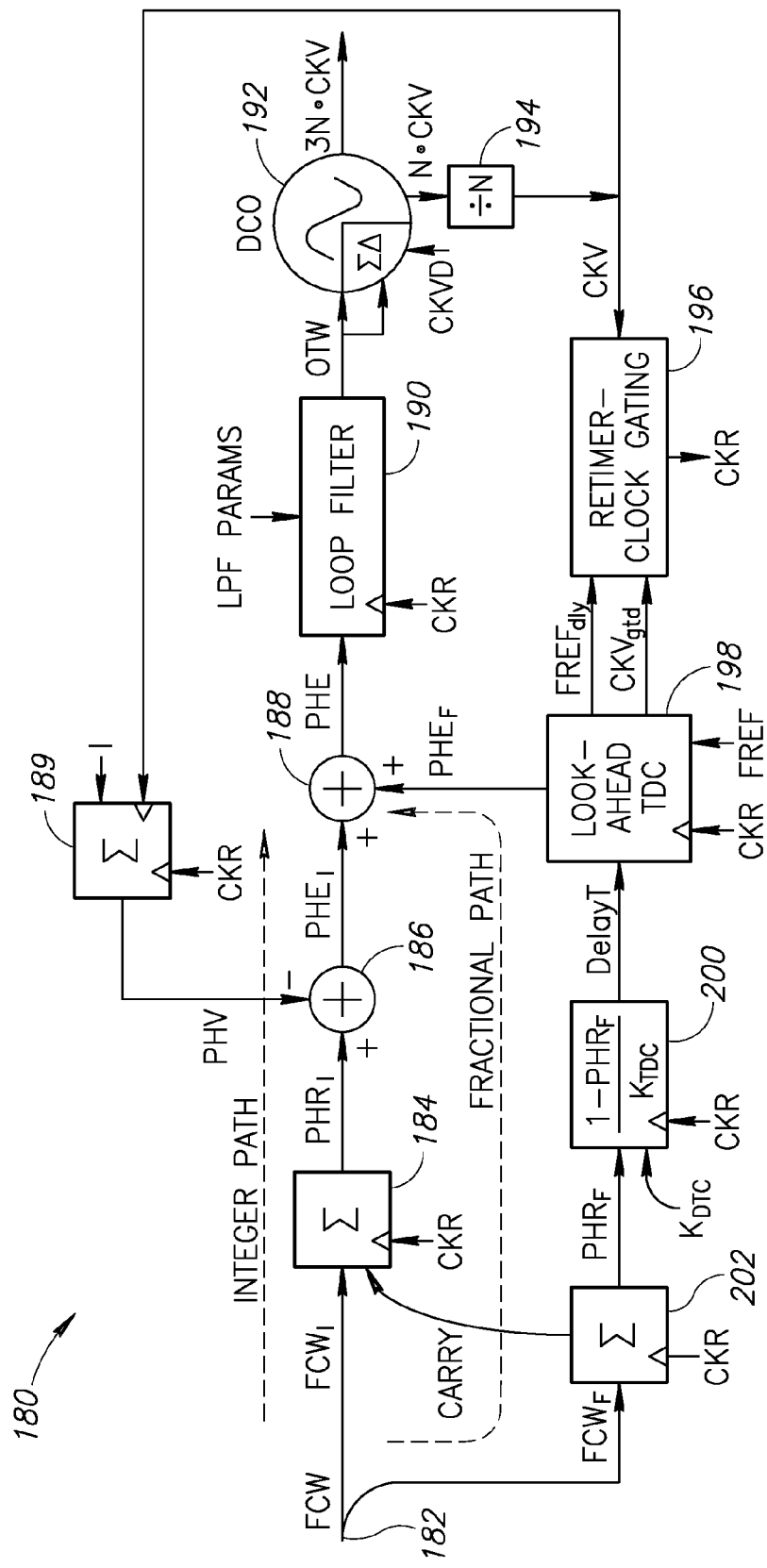
FIG. 19 is a block diagram illustrating an example all digital phase locked loop incorporating the oscillator/frequency generator of the present invention.

A block diagram illustrating an example all digital phase locked loop (ADPLL) incorporating the oscillator/frequency generator of the present invention is shown in FIG. 19. The frequency command word (FCW) 182 is split into its integer $FCW_I$ and fractional $FCW_F$ parts, with separate reference accumulators 184, 202 that generate the integer and fractional part of the reference phase, $PHR_I$ and $PHR_F$, respectively. In order to properly accumulate the FCW as a whole, a carry is transferred to the integer accumulator whenever an overflow of the fractional part occurs. A synchronous 8-bit counter serves as the variable accumulator 189 and produces the variable phase PHV that is subtracted from $PHR_1$ via subtractor 186 to provide the integer part of the phase error $PHE_I$. $PHR_F$ is used to calculate the "look-ahead TDC" delay code based on the estimated delay characteristic of the look-ahead TDC, (i.e. a combination of a digital-to-time converter followed by a TDC), which in turn is applied to the look-ahead TDC 198 through a gain. A look-ahead TDC gain estimation block 200, based on an iterative adaptation algorithm, is implemented on chip to dynamically track delay estimation errors due to PVT variations. The digitized output of the TDC represents the fractional part of the phase error, $PHE_F$ that is combined with $PHE_1$ via summer 188 to yield the total fixed-point representation of the phase error PHE.

The phase error PHE is then filtered via loop filter 190, in order to properly set the dynamics of the loop. A reconfigurable proportional integral controller within the loop filter block 190 is followed by a DCO decoder also within the loop filter block 190 to generate the oscillator tuning word (OTW). The DCO 192 comprises the oscillator/frequency generator described supra. The DCO generates two signals: one being 3N·CKV (at 60 GHz), which goes to the output, and a second N·CKV (at 20 GHz) which goes to the dividers 194 for phase detection. In one embodiment, the DCO includes switched capacitor banks that are dithered using a $2^{nd}$-order MASH ΣΔ modulator in order to achieve a finer equivalent frequency resolution and push the quantization noise at higher offset frequencies where they are more easily filtered out and do not contribute significantly to the total jitter. The operation frequency of the ΣΔ modulators can be dynamically selected between different divider versions of the oscillator output in order to meet the required performance as a trade-off between power consumption and jitter.

In one embodiment, for the feasibility of the variable accumulator implementation, the feedback path was chosen to operate at a maximum 2.5 GHz, which means that a divide-by-two version of the transformer-based DCO output is fed back to the variable accumulator and the look-ahead TDC. Division by two is achieved using a current mode logic (CML) ÷4 divider cascaded with a CMOS digital divider. These dividers are represented in FIG. 19 by the ÷N block 194. Since the loop feedback operates on a divided version of the output, the effective frequency command word is adjusted accordingly. Therefore, one half of the multiplication ratio is accumulated at the ADPLL.

As mentioned supra, the retimer clock gating circuit 196 generates the clock signals for the ADPLL. The CKR clock is used as a global digital clock of the ADPLL loop (at the reference clock rate) to resample the output of the variable accumulator and to generate a gated version of the variable feedback clock $CKV_{gtd}$.

One application of the oscillator based ADPLL of FIG. 19 is in a wideband digital polar transmitter (not shown). In the transmitter a switched capacitor bank in the DCO is tuned to the desired channel while the oscillator/frequency generator of the invention is used to perform the wideband FM modulation.

Figure 20:
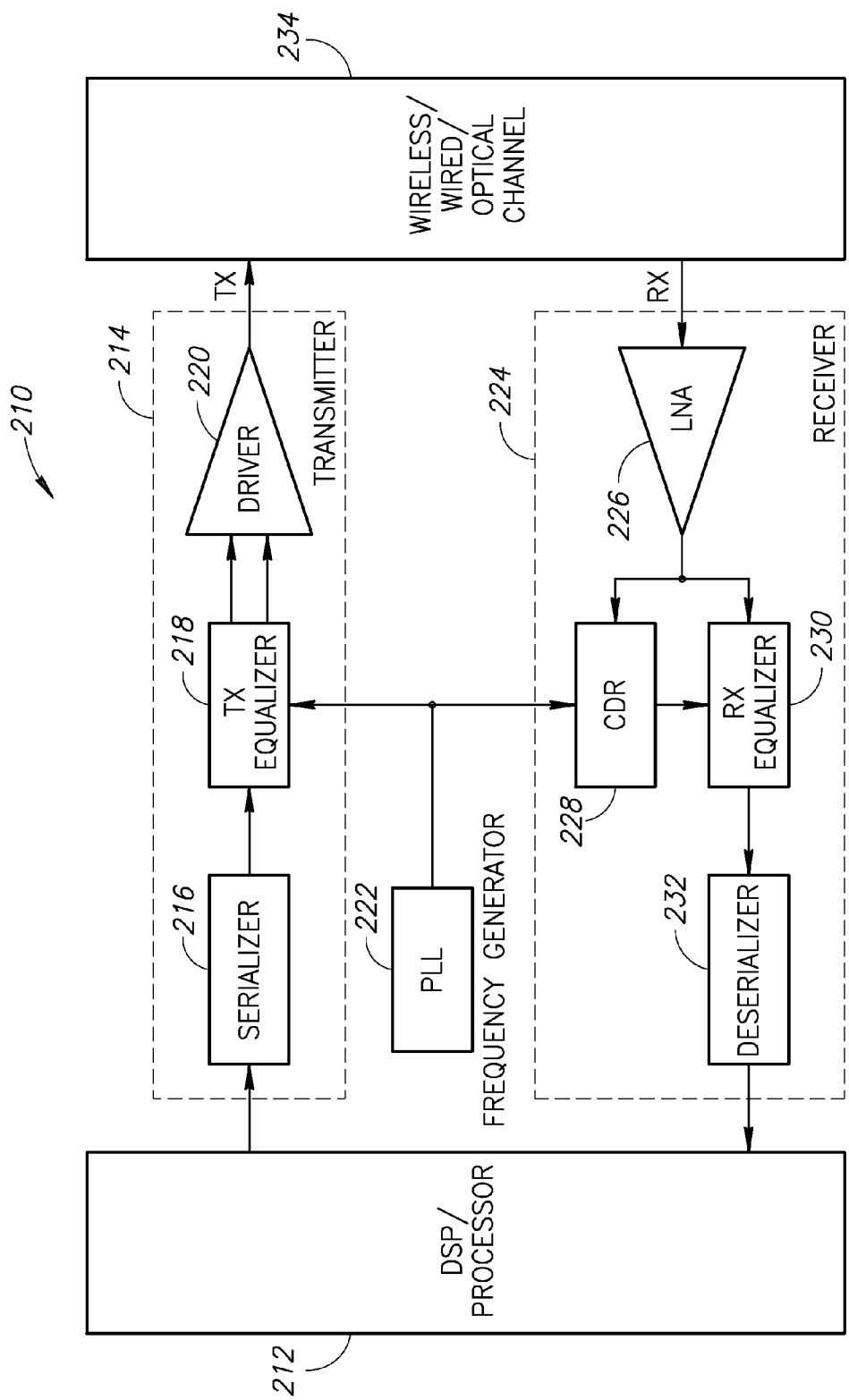
FIG. 20 is a block diagram illustrating an example wireline transceiver incorporating the oscillator/frequency generator of the present invention.

A block diagram illustrating an example wireline transceiver incorporating the oscillator/frequency generator of the present invention is shown in FIG. 20. The transceiver, generally referenced 210, comprises a DSP/processor (including a baseband processor in one embodiment) 212, transmitter 214, receiver 224, PLL based frequency generator 222 and the channel (e.g., wireline) 234. Note that a person skilled in the art can modify the transceiver 210 to operate as a wireless transceiver. The transmitter 214 comprises a serializer 216, TX equalizer 218 and driver 220. The receiver 224 comprises a low noise amplifier (LNA) 226, RX equalizer 230, clock data recovery (CDR) 228 and deserializer 232.

In this example embodiment, the frequency generator 222 comprises the self injection locked oscillator as described supra. In another embodiment, the frequency generator may comprise the ADPLL circuit described supra in connection with FIG. 24. The current switching oscillator offers wideband frequency modulation with very fine resolution. It efficiently provides high resolution and high linearity while offering a wide tuning range which is highly desirable in wireline systems.

Mobile Device Incorporating the Oscillator/Frequency Generator Based DCO

Figure 21:
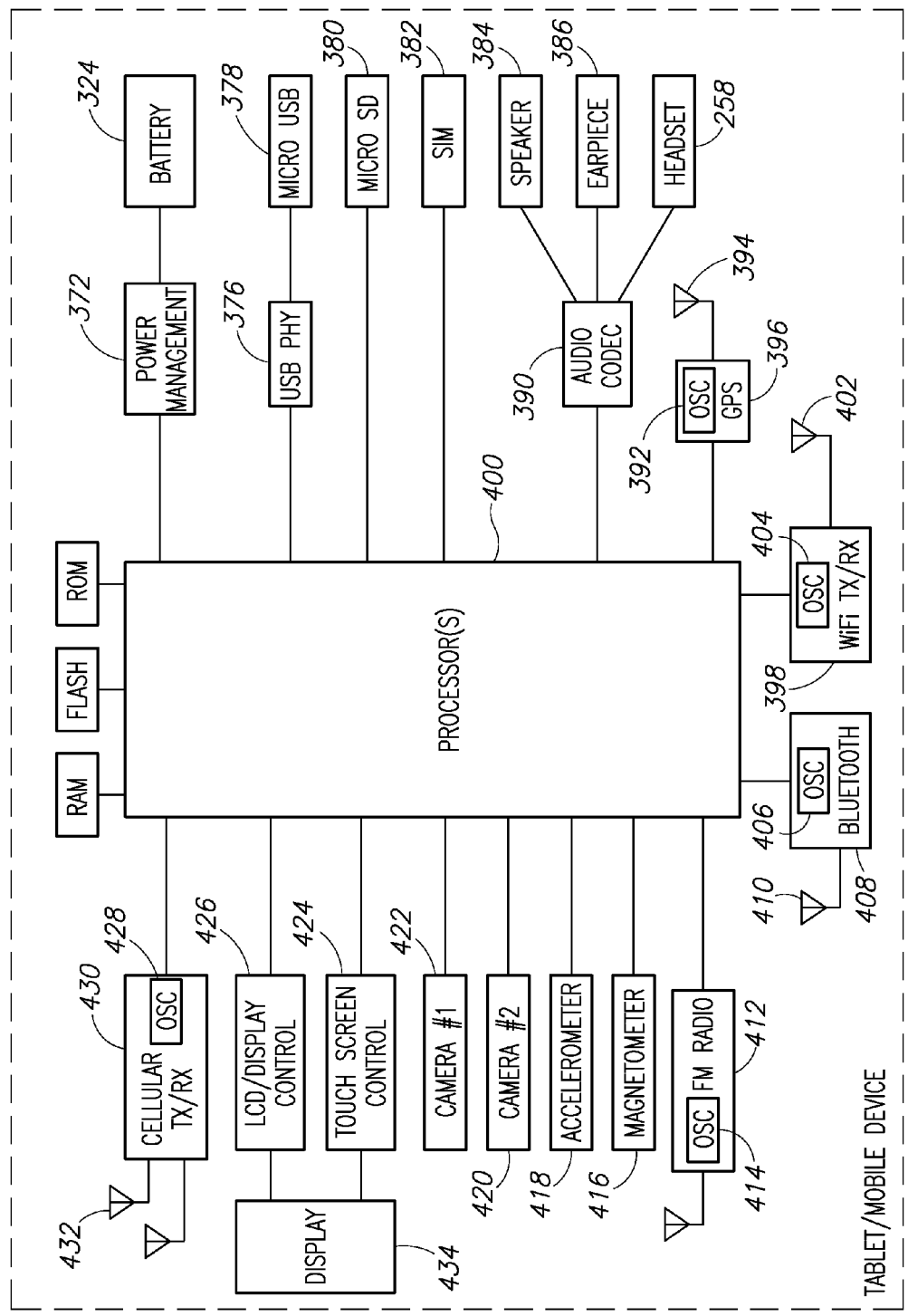
FIG. 21 is a block diagram illustrating an example mobile device incorporating the oscillator/frequency generator of the present invention.

A block diagram illustrating an example tablet/mobile device incorporating a frequency generator that includes the oscillator/frequency generator based DCO circuit of the present invention is shown in FIG. 21. The mobile device is preferably a two-way communication device having voice and/or data communication capabilities. In addition, the device optionally has the capability to communicate with other computer systems via the Internet. Note that the mobile device may comprise any suitable wired or wireless device such as multimedia player, mobile communication device, digital still or video camera, cellular phone, smartphone, iPhone, PDA, PNA, Bluetooth device, tablet computing device such as the iPad or other iOS device, Android device, Surface, Nexus, Google Glass, etc. For illustration purposes only, the device is shown as a mobile device, such as a cellular based telephone, smartphone or superphone. Note that this example is not intended to limit the scope of the mechanism as the invention can be implemented in a wide variety of communication devices. It is further appreciated the mobile device shown is intentionally simplified to illustrate only certain components, as the mobile device may comprise other components and subsystems beyond those shown.

The mobile device, generally referenced 370, comprises one or more processors 400 which may comprise a baseband processor, CPU, microprocessor, DSP, etc., optionally having both analog and digital portions. The mobile device may comprise a plurality of cellular radios 430 and associated antennas 432. Radios for the basic cellular link and any number of other wireless standards and Radio Access Technologies (RATs) may be included. Examples include, but are not limited to, Third Generation (3G) Long Term Evolution (LTE), Code Division Multiple Access (CDMA), Personal Communication Services (PCS), Global System for Mobile Communication (GSM)/GPRS/EDGE 3G; WCDMA; WiMAX for providing WiMAX wireless connectivity when within the range of a WiMAX wireless network; Bluetooth for providing Bluetooth wireless connectivity when within the range of a Bluetooth wireless network; WLAN for providing wireless connectivity when in a hot spot or within the range of an ad hoc, infrastructure or mesh based wireless LAN (WLAN) network; near field communications; UWB; GPS receiver for receiving GPS radio signals transmitted from one or more orbiting GPS satellites, FM transceiver provides the user the ability to listen to FM broadcasts as well as the ability to transmit audio over an unused FM station at low power, such as for playback over a car or home stereo system having an FM receiver, digital broadcast television, etc.

The mobile device may also comprise internal volatile storage 436 (e.g., RAM) and persistent storage 440 (e.g., ROM) and flash memory 438. Persistent storage 436 also stores applications executable by processor(s) 400 including the related data files used by those applications to allow device 370 to perform its intended functions. Several optional user-interface devices include trackball/thumbwheel which may comprise a depressible thumbwheel/trackball that is used for navigation, selection of menu choices and confirmation of action, keypad/keyboard such as arranged in QWERTY fashion for entering alphanumeric data and a numeric keypad for entering dialing digits and for other controls and inputs (the keyboard may also contain symbol, function and command keys such as a phone send/end key, a menu key and an escape key), headset 388, earpiece 386 and/or speaker 384, microphone(s) and associated audio codec 390 or other multimedia codecs, vibrator for alerting a user, one or more cameras and related circuitry 420, 422, display(s) 434 and associated display controller 426 and touchscreen control 424. Serial ports include a micro USB port 378 and related USB PHY 376 and micro SD port 380. Other interface connections may include SPI, SDIO, PCI, USB, etc. for providing a serial link to a user's PC or other device. SIM/RUIM card 382 provides the interface to a user's SIM or RUIM card for storing user data such as address book entries, user identification, etc.

Portable power is provided by the battery 374 coupled to power management circuitry 372. External power is provided via USB power or an AC/DC adapter connected to the power management circuitry that is operative to manage the charging and discharging of the battery. In addition to a battery and AC/DC external power source, additional optional power sources each with its own power limitations, include: a speaker phone, DC/DC power source, and any bus powered power source (e.g., USB device in bus powered mode).

Operating system software executed by the processor 400 is preferably stored in persistent storage (i.e. ROM 440), or flash memory 438, but may be stored in other types of memory devices. In addition, system software, specific device applications, or parts thereof, may be temporarily loaded into volatile storage 436, such as random access memory (RAM). Communications signals received by the mobile device may also be stored in the RAM.

The processor 400, in addition to its operating system functions, enables execution of software applications on the device 370. A predetermined set of applications that control basic device operations, such as data and voice communications, may be installed during manufacture. Additional applications (or apps) may be downloaded from the Internet and installed in memory for execution on the processor. Alternatively, software may be downloaded via any other suitable protocol, such as SDIO, USB, network server, etc.

Other components of the mobile device include an accelerometer 418 for detecting motion and orientation of the device, gyroscope 417 for measuring or maintaining orientation, magnetometer 416 for detecting the earth's magnetic field, FM radio 412 and antenna 413, Bluetooth radio 408 and antenna 410, Wi-Fi radio 398 including antenna 402 and GPS 392 and antenna 394.

In accordance with the invention, the mobile device 370 comprises one or more oscillator circuits, each incorporating the oscillator/frequency generator circuit of the present invention. Numerous embodiments of the mobile device 370 may comprise an oscillator/frequency generator circuit 428 as described supra incorporated in the one or more cellular radios 430; as oscillator/frequency generator circuit 414 as described supra incorporated in the FM radio 412; an oscillator/frequency/frequency generator circuit 406 as described supra incorporated in the Bluetooth radio 408; an oscillator circuit 404 as described supra incorporated in the Wi-Fi radio 398; and an oscillator/frequency generator circuit 396 as described supra incorporated in the GPS radio 392.

Internet of Things (IoT) Node Incorporating the Oscillator/Frequency Generator Based DCO The Internet of Things (IoT) is defined as the network of physical objects or "things" embedded with electronics, software, sensors and network connectivity, which enables these objects to collect and exchange data. The IoT allows objects to be sensed and controlled remotely across existing network infrastructure, creating opportunities for more direct integration between the physical world and computer-based systems, and resulting in improved efficiency, accuracy and economic benefit. Each thing is uniquely identifiable through its embedded computing system but is able to interoperate within the existing Internet infrastructure. Experts estimate that the IoT will consist of almost 50 billion objects by 2020.

Figure 22:
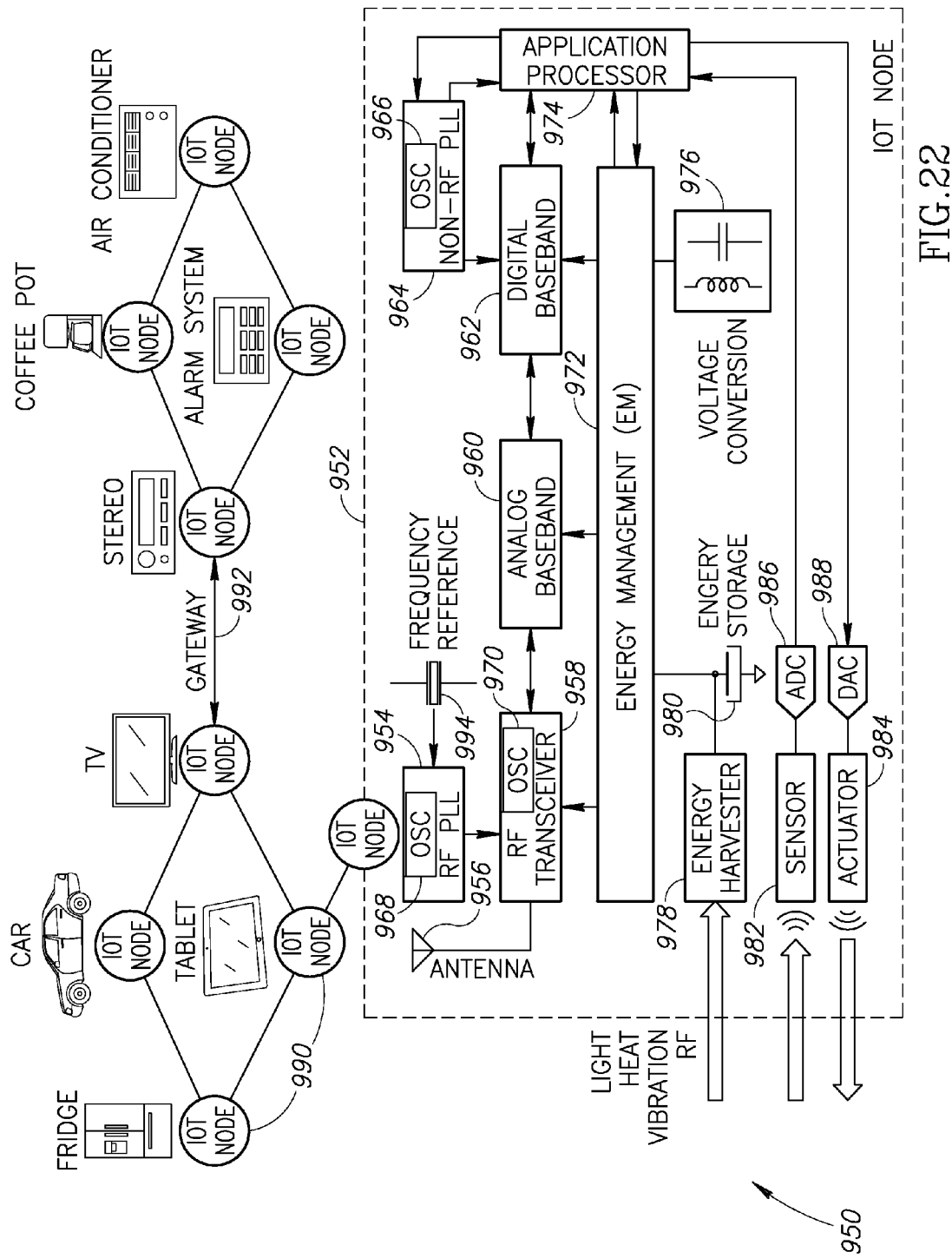
FIG. 22 is a block diagram illustrating an example IoT node incorporating the oscillator/frequency generator of the present invention.

A block diagram illustrating an example IoT node incorporating the oscillator/frequency generator of the present invention is shown in FIG. 22. The example IoT, generally referenced 950, comprises a plurality of nodes 990. The architecture of an example IoT node 952 shown can be fully integrated as a System on Chip (SoC) on a single IC chip in nanoscale CMOS. It contains the radio subsystem to wirelessly communicate with other nodes and gateways 992, application processor to impart a certain amount of local "intelligence", sensor and an optional actuator to interface with the environment and energy management to harvest energy (light, heat, vibration or RF power) from the environment and/or convert the voltage levels to those required by the functional circuitry. The RF and non-RF frequency synthesizers provide local oscillator and processor clocks, respectively. A frequency reference 994 provides a fixed clock with excellent long term stability to the frequency synthesizers. In one embodiment, the oscillator/frequency generator of the present invention described supra is incorporated in the RF synthesizer 954 as circuit block 968; non-RF synthesizer 964 as circuit block 966; and/or RF transceiver 958 as circuit block 970.

The RF transceiver 958 interfaces with an antenna 956. The RF signals on the order of 100's of MHz up to several GHz are upconverted and downconverted there to the lower (i.e. baseband) frequencies, which are then processed in the analog baseband circuitry. The conversion from analog to digital (i.e. ADC), and vice versa (i.e. DAC), is also performed there. The digital baseband completes the physical layer of a chosen communication standard. The application processor performs various control and signal processing functions and is responsible for giving a level of "intelligence" to the IoT node.

The RF frequency synthesizer 954 is realized as an all-digital PLL (ADPLL) and provides a local oscillator signal to the RF transceiver 958. The non-RF frequency synthesizer 964 provides clocks to the digital baseband 962 and application processors 974. The clock frequency has to be dynamically switchable in response to the changing computational load conditions. The energy management (EM) circuitry 972 provides energy conversion between the energy harvester 978 and/or low-capacity storage battery 980 and all the IoT functional circuits. The EM circuit carries out several functions. First, it boosts the voltage from the energy harvester (e.g., light, heat, vibration, RF electromagnetic, etc.) to that required by the nanoscale CMOS circuits, which is in the range of 0.7 to 1.0 V assuming 40 nm CMOS technology. This is performed by a dedicated DC-DC boost converter 976. Second, it down-shifts the energy from a battery, which is on the order of 1.5 to 3.6 V to that required by the nanoscale CMOS circuits. This is performed by a dedicated DC-DC buck converter 976. Third, both boost and buck converters use energy storage passive devices, i.e. capacitor or inductor for storing electrical and magnetic energy, respectively, in order to change the voltage level with high efficiency. The high conversion efficiency must be maintained across the entire range of the allowed loads. Fourth, the EM needs to provide many power supply domains. This is dictated by the different voltage level requirements during voltage scaling. Fifth, the EM supply domains preferably provide individually adjustable voltage levels. The supply voltage level of digital logic circuits widely vary depending on the fast changing real time computational load conditions, while the voltage level of digital RF and analog circuits experience less of such variance, and mainly due to temperature and operating frequency, as well as communication channel conditions. Moreover, the analog circuits have to be properly biased, which normally prevents them from operating at near-threshold conditions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A frequency generator circuit, comprising:
    an oscillator circuit, said oscillator circuit comprising;
        a transformer based LC tank circuit operative to generate a feedforward signal containing a fundamental frequency component and a third harmonic frequency component;
        wherein said LC tank circuit is operative to substantially boost said third harmonic frequency component;
        said oscillator circuit operative to generate a feedback signal containing substantially only said fundamental frequency component; and
    wherein said feedback signal is utilized for purposes of phase detection.

2. The frequency generator circuit according to claim 1, wherein said wherein said oscillator circuit is operative to generate positive loop feedback at said fundamental frequency and negative loop feedback at said third harmonic frequency thereby satisfying Barkhausen criterion at said fundamental frequency but not at said third harmonic frequency resulting in a single oscillation mode at said fundamental frequency.

3. The frequency generator circuit according to claim 1, wherein said fundamental frequency is ~20 GHz and said third harmonic frequency is ~60 GHz.

4. The frequency generator circuit according to claim 1, further comprising circuitry operative to attenuate said fundamental frequency component from said feedforward signal.

5. The frequency generator circuit according to claim 1, wherein said tank circuit comprises one or more tuning switching capacitors.

6. An oscillator circuit, comprising:
    a pair of transistors for sustaining the oscillation of said oscillator circuit, said transistors each having a gate terminal and a drain terminal;
    a transformer comprising a primary winding and a secondary winding, said primary winding coupled to both said drain terminals of said transistors, said secondary winding coupled to both said gate terminals of said transistors;
    a first tunable capacitor coupled to said primary transformer winding;
    a second tunable capacitor coupled to said secondary transformer winding;
    wherein said oscillator exhibits a first input impedance magnitude peak at a fundamental frequency and a second input impedance magnitude peak at a third harmonic frequency;
    wherein Barkhausen criterion is satisfied at said fundamental frequency but not at said third harmonic frequency thereby said oscillator circuit has a single oscillation mode at said fundamental frequency; and
    wherein a gate waveform is combined with a drain waveform to perform active fundamental cancellation.

7. The oscillator circuit according to claim 6, further comprising a buffer circuit connected to said oscillator circuit and operative to attenuate said fundamental frequency component.

8. The oscillator circuit according to claim 6, wherein said fundamental frequency is ~20 GHz and said third harmonic frequency is ~60 GHz.

9. A millimeter wave (mm-wave) frequency generator circuit, comprising:
   a phase/frequency detector;
   a low pass filter coupled to said phase/frequency detector;
   an oscillator incorporating a transformer based LC tank circuit and coupled to said low pass filter, said oscillator operative to:
      generate an output signal having both fundamental and third harmonic components;
      boost the level of said third harmonic component;
      satisfy Barkhausen criterion at the fundamental frequency but not at the third harmonic frequency wherein said oscillator circuit has a single oscillation mode at said fundamental frequency;
   a power amplifier coupled to the output of said oscillator and adapted to receive as input the output signal from said oscillator, said power amplifier operative to substantially filter the fundamental component from said output signal while amplifying the third harmonic component thereof; and
   a frequency divider coupled to said oscillator and said phase/frequency detector.

10. The frequency generator circuit according to claim 9, wherein said oscillator comprises:
   a pair of transistors for sustaining the oscillation of said oscillator, said transistors each having a gate terminal and a drain terminal;
   a transformer comprising a primary winding and a secondary winding, said primary winding coupled to both said drain terminals of said transistors, said secondary winding coupled to both said gate terminals of said transistors;
   a first tunable capacitor coupled to said primary transformer winding; and
   a second tunable capacitor coupled to said secondary transformer winding.

11. The frequency generator circuit according to claim 10, wherein said first tunable capacitor and said second tunable capacitor each comprises one or more tuning switching capacitors.

12. The frequency generator circuit according to claim 9, wherein said fundamental frequency is ~20 GHz and said third harmonic frequency is ~60 GHz.

13. The frequency generator circuit according to claim 9, further comprising an active fundamental cancelation circuit coupled to said oscillator and operative to substantially attenuate said fundamental frequency component from said output signal.

14. A millimeter wave (mm-wave) frequency generator circuit, comprising:
   a phase/frequency detector;
   a low pass filter coupled to said phase/frequency detector;
   an oscillator incorporating a transformer based LC tank circuit and coupled to said low pass filter, said oscillator comprising:
      an active network having an input and an output, said active network operative to generate an active signal for sustaining the oscillation of said oscillator;
      said transformer based resonator differential tank circuit coupled to said active network and operative to generate a feedback signal coupled to said active network input;
      wherein said differential tank circuit has a first impedance magnitude peak at a fundamental frequency and a second impedance magnitude peak at a third harmonic frequency;
      wherein said oscillator satisfies Barkhausen criterion at the fundamental frequency but not at the third harmonic frequency so that said oscillator circuit has a single oscillation mode at said fundamental frequency;
   a power amplifier coupled to the output of said oscillator and adapted to receive as input an output signal from said oscillator, said power amplifier operative to substantially attenuate the fundamental component from said output signal while amplifying the third harmonic component thereof; and
   a frequency divider coupled to said oscillator and said phase/frequency detector.

15. The frequency generator circuit according to claim 14, wherein said tank circuit comprises one or more tuning switching capacitors.

16. The frequency generator circuit according to claim 14, further comprising an active fundamental cancelation circuit connected to said oscillator and operative to substantially attenuate said fundamental frequency component from said output signal.

17. The frequency generator circuit according to claim 14, wherein said fundamental frequency is ~20 GHz and said third harmonic frequency is ~60 GHz.

18. The frequency generator circuit according to claim 14, wherein said LC tank circuit is configured to substantially boost said third harmonic frequency.

19. The frequency generator circuit according to claim 1, further comprising an active fundamental cancelation circuit connected to said oscillator circuit and operative to substantially attenuate said fundamental frequency component from said feedforward signal.

20. The frequency generator circuit according to claim 1, further comprising a buffer circuit connected to said oscillator circuit and operative to reject said fundamental frequency component.

* * * * *